United States Patent [19]

Fathauer et al.

[11] 4,398,304

[45] Aug. 9, 1983

[54] SCANNING RADIO RECEIVER INCLUDING DETECTOR CIRCUIT FOR AM AND FM RECEPTION

[75] Inventors: George H. Fathauer; Wayne Holst, both of Mesa, Ariz.

[73] Assignee: Masco Corporation, Taylor, Mich.

[21] Appl. No.: 290,924

[22] Filed: Aug. 7, 1981

Related U.S. Application Data

[63] Continuation of Ser. No. 34,593, Apr. 30, 1979, abandoned.

[51] Int. Cl.³ .............................................. H03J 7/18
[52] U.S. Cl. .................................... 455/168; 455/180; 455/194; 455/212
[58] Field of Search ............................... 455/142–144, 455/168, 180, 190, 194, 218, 212, 225

[56] References Cited

U.S. PATENT DOCUMENTS

| | | | |
|---|---|---|---|
| 3,090,918 | 5/1963 | Arguimbau | 455/212 |
| 3,345,571 | 10/1967 | Selwyn | 455/143 |
| 3,725,788 | 4/1973 | Fathauer | 455/168 |
| 3,728,634 | 4/1973 | Watkinson | 455/143 |
| 3,824,475 | 7/1974 | Pflasterer | 455/168 |
| 4,011,515 | 3/1977 | Hanson | 455/168 |
| 4,135,158 | 1/1979 | Parmet | 455/143 |

Primary Examiner—Jin F. Ng
Attorney, Agent, or Firm—Neuman, Williams, Anderson & Olson

[57] ABSTRACT

There is disclosed a scanning radio receiver for use on the frequencies assigned to the Public Safety Radio Services in which frequency modulation is used and which also will receive the aircraft band from 118 to 136 MHz in which amplitude modulation is used. A detector circuit is provided including separate AM and FM demodulators with there being a squelch circuit associated with the FM demodulator, the squelch circuit being operative in AM as well as FM reception. A window detector circuit for minimizing the effect of strong signals outside a desired band is also associated with the FM demodulator and is also operative during AM reception. Common circuits are used for both AM and FM reception, including common RF portions, a common first IF portion operative at 10.8 MHz, a common second mixer and stages of a second IF amplifier operative at 400 KHz.

3 Claims, 35 Drawing Figures

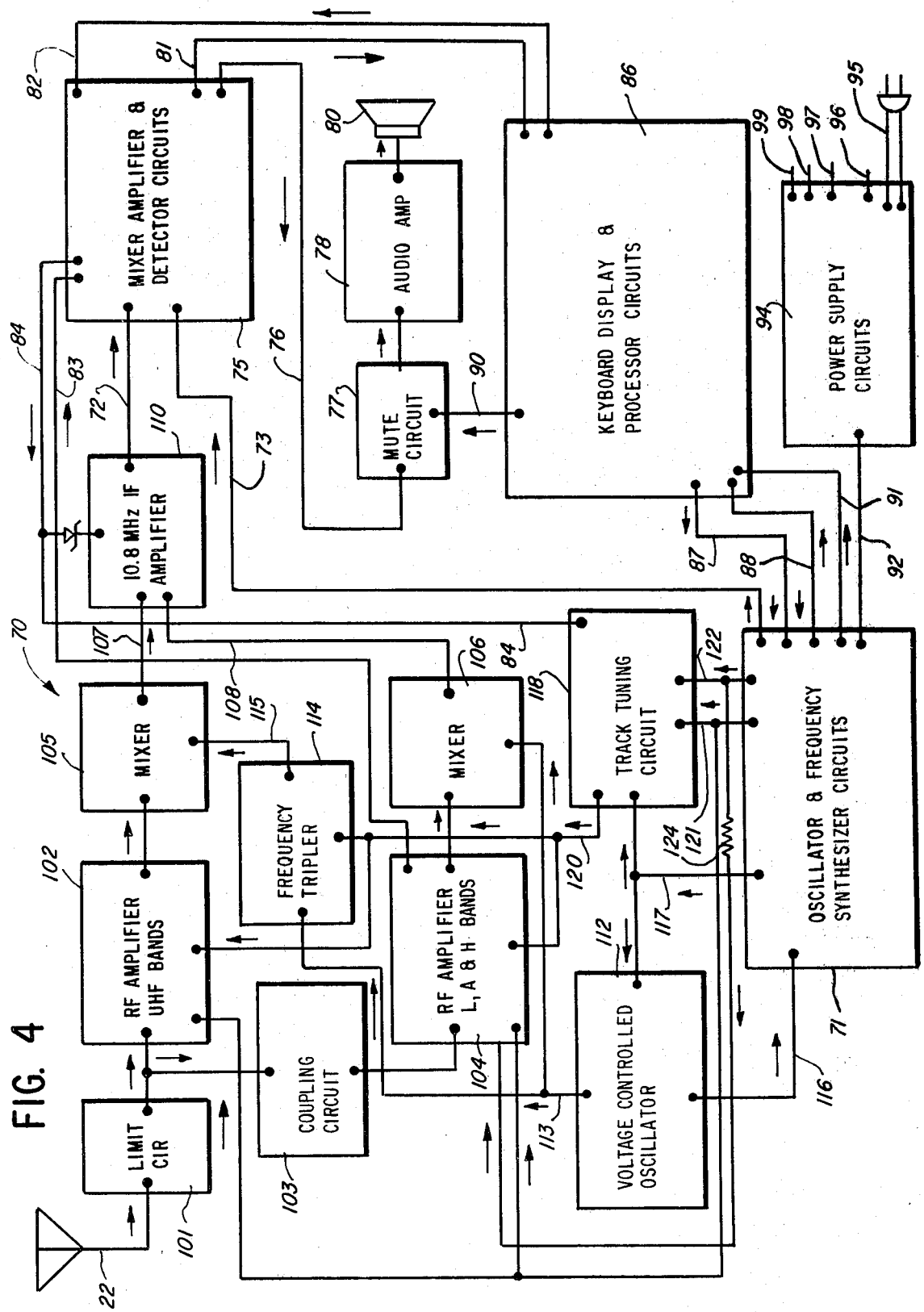

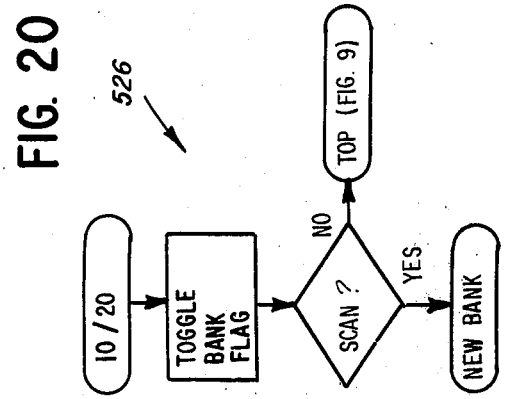
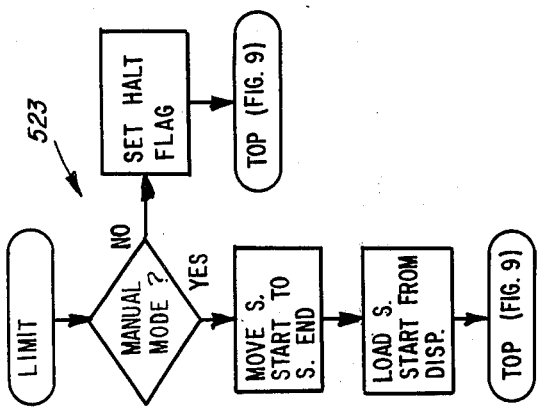
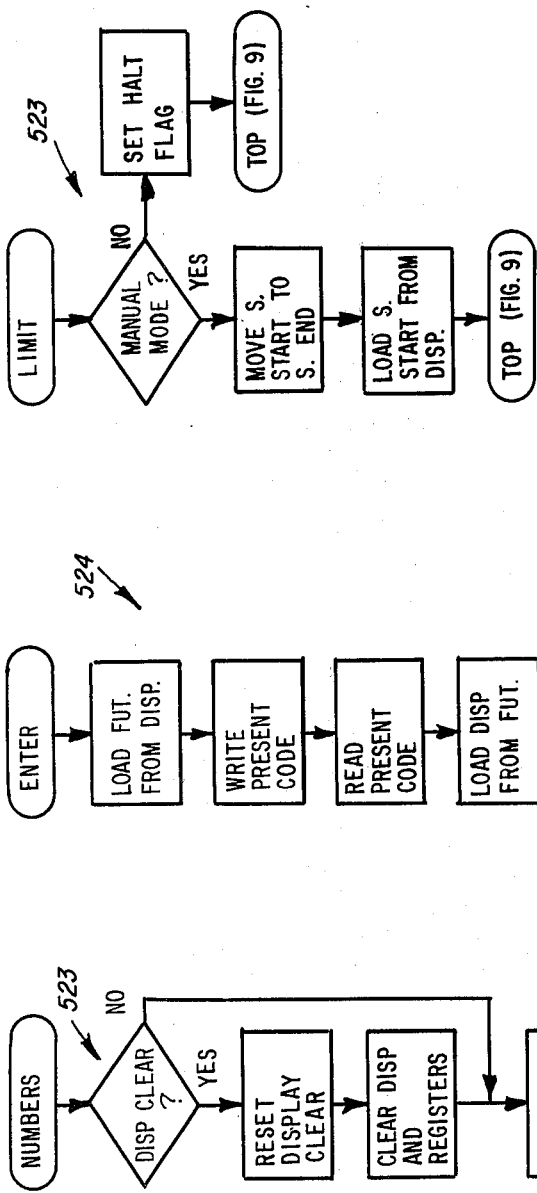
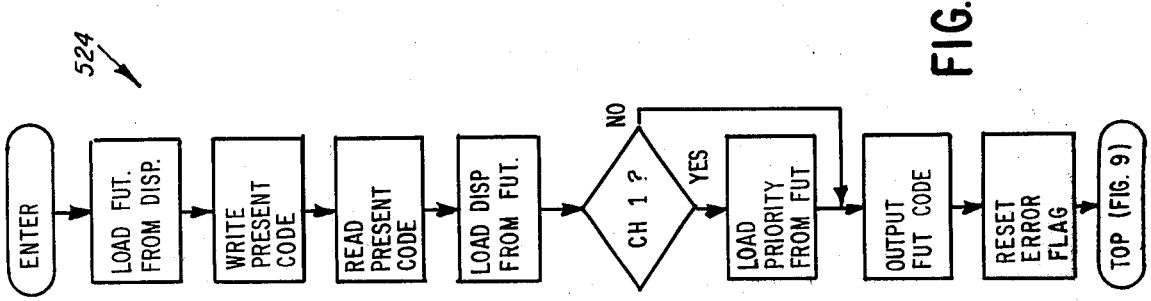

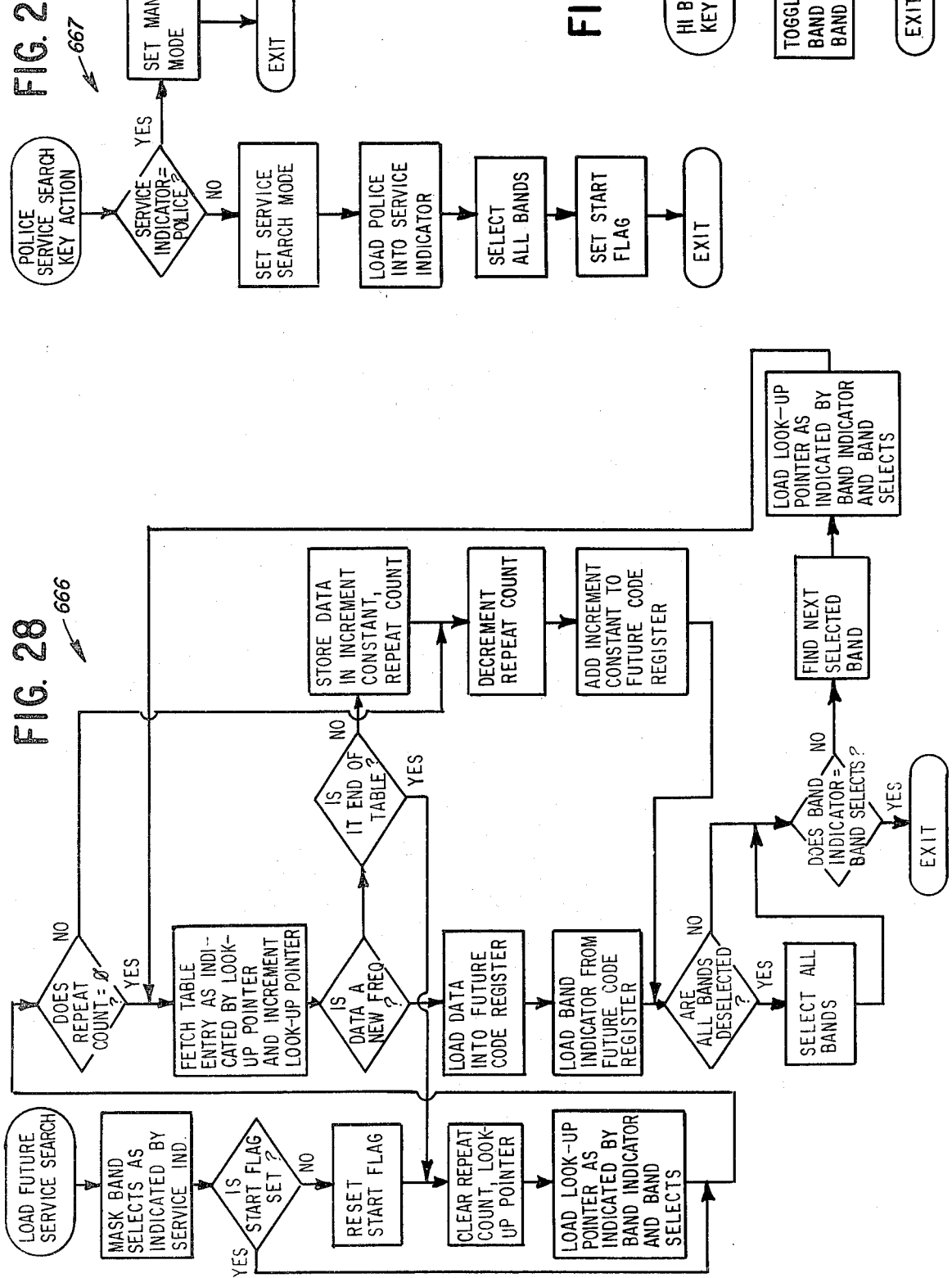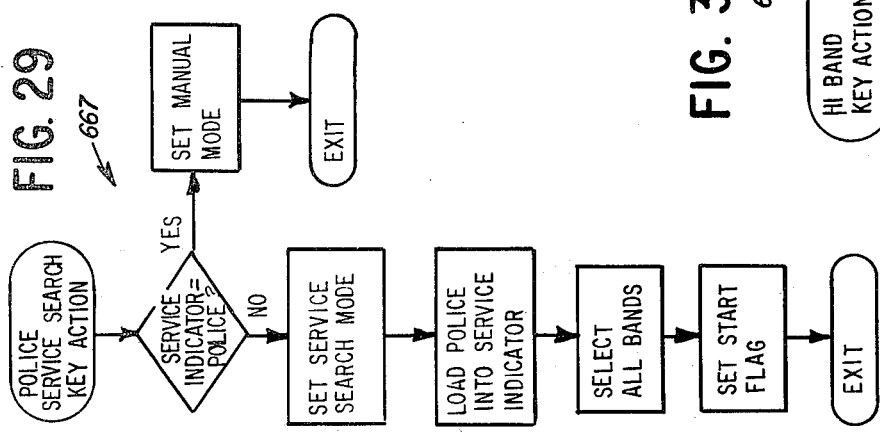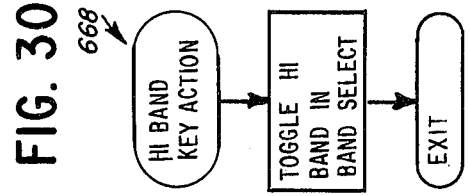

SCANNING RADIO RECEIVER INCLUDING DETECTOR CIRCUIT FOR AM AND FM RECEPTION

This application is a continuation of U.S. application Ser. No. 034,593, filed on Apr. 30, 1979, now abandoned.

BACKGROUND OF THE INVENTION

This invention relates to scanning radio receivers and, more particularly, to scanning radio receivers particularly useful on the frequencies assigned to the Public Safety Radio Services as well as other frequencies.

Scanning radio receivers are well known in the prior art and have found particular utility for the reception of radio signals on the frequencies assigned by the United States Federal Communications Commission to the Public Safety Radio Services. In the past, many such radio receivers used crystals as the tuning element to provide the necessary local oscillator signals and required the presence of one crystal for each frequency the receiver was capable of tuning. Examples of such receivers are those shown in U.S. Pat. Nos. 3,531,724 to G. H. Fathauer, 3,665,318 to S. J. Hoffman, et al., 3,714,585 to R. C. Koch, 3,725,788 to G. H. Fathauer, 3,794,925 to K. Imazeki, 3,801,914 to K. Imazeki, 3,821,651 to G. H. Fathauer, et al., 3,873,924 to G. H. Fathauer, 3,883,808 to J. E. Boone, 3,824,475 to P. W. Pflasterer, and 3,987,400 to G. H. Fathauer. Recently, scanning radio receivers using frequency synthesizing techniques have been provided which eliminated the need for a large number of crystals in radio receivers capable of being tuned to a large number of frequencies. Such receivers are shown in U.S. Pat. Nos. 3,937,972 to S. C. Snell, 3,961,261 to P. W. Pflasterer, 4,000,468 to J. R. Brown, et al., 4,027,251 to G. H. Fathauer, et al., 4,114,103 to P. W. Pflasterer, and 4,123,715 to G. H. Fathauer. There has also been provided by the prior art scanning radio receivers using frequency synthesizing techniques wherein the frequency synthesizing circuitry was controlled by the operation of a processing means such as a microprocessor. Exemplary radio receivers of this last mentioned type are disclosed in U.S. Pat. Nos. 3,962,644 and 4,092,594 both to W. Baker as well as the presently pending United States application Ser. Nos. 847,497 of G. H. Fathauer, et al., 847,566 of G. H. Fathauer, 000,905 of W. L. Williamson, et al., and 001,013 of A. Khan, et al.

The Federal Communications Commission specifies that frequency modulation be used on all the frequencies assigned to the Public Safety Radio Services. This specification, of course, has been a convenience in the past because it meant that radio receivers designed to receive signals at such frequencies need only include circuitry for responding to signals including one type of modulation, i.e., frequency modulation. However, it has become desirable to provide scanning radio receivers which have the capability of receiving signals at the frequencies assigned by the Federal Communications Commission for other services such as the aircraft communications service as well as the Public Safety Radio Service frequencies. The Federal Communications Commission has specified that amplitude modulation be used on the frequencies assigned for aircraft communication. Scanning radio receivers for use on the aircraft communication frequencies have previously been known, but those receivers were often capable of receiving only the aircraft communication frequencies and thus again only needed the facility for responding to signals of one modulation type, i.e., amplitude modulation. U.S. Pat. No. 3,725,788 to G. H. Fathauer discloses a radio receiver capable of scanning two Public Safety Radio Service frequencies and also of receiving conventional amplitude modulated broadcast signals. Even that receiver of now seemingly rather limited capabilities included completely separate radio frequency amplifier and mixer stages, local oscillator stages, intermediate frequency amplifier and filter stages, and demodulator stages for use with signals having the two different types of modulation. Further, it needed no circuitry to provide a scanning operation in response to amplitude modulated signals.

The problems involved in producing a single scanning receiver capable of receiving both the public safety and aircraft communication frequencies have not been clearly recognized and solutions have not been evident. A receiver including circuitry for demodulating both amplitude modulated and frequency modulated signals must perform under the operating conditions imposed by the environment of a scanning radio receiver.

To elaborate somewhat, in its scanning mode of operation a scanning radio receiver is successively tuned to different frequencies previously selected by the user until it arrives at a frequency at which a signal above a minimum signal strength is received. During the time it is tuned to any individual frequency, it must ascertain whether a signal of sufficient strength is present at that frequency, and this is usually done by evaluating some characteristic (such as high frequency noise content) of the demodulated signal. The scanning process is typically performed at the rate of as many as ten or more frequencies per second. Thus, if aircraft communication and public safety frequencies are to be scanned successively and intermixed in the order of scanning, it is necessary that some mechanism be provided for altering the demodulation operation of the receiver between frequency and amplitude demodulation depending on the form of modulation used at the frequency to which the receiver is tuned at any instant.

It is also desirable, or course, in the design of a scanning radio receiver to minimize the cost of the receiver to the extent possible while maintaining the performance level of the receiver. However, it has not been recognized that in a scanning radio receiver for receipt of both amplitude modulated and frequency modulated signals it is desirable to avoid the use of separate and independent circuitry for performing the necessary reception functions for amplitude and frequency modulated signals. An essential portion of a scanning radio receiver is the provision of a squelch or similar circuit to provide an output signal indicative of the presence or absence of a signal above a minimum signal level at the frequency to which the receiver is tuned. It is desirable to avoid separate and independent circuitry for providing such a signal with amplitude and frequency modulated signals. Further in a scanning radio receiver operable in a search mode wherein the receiver is successively tuned to each of the assigned frequencies within a predetermined frequency range until a signal above a minimum signal strength is found, it is generally necessary to include circuitry for preventing the receiver from erroneously responding to a received signal when it is not correctly tuned to that signal. (This problem and a solution thereto forms a part of application Ser. No. 847,566 referred to above.) However, it is also desirable to avoid the use of separate and independent such circuitry with amplitude and frequency modulated signals.

SUMMARY OF THE INVENTION

There are provided by this invention scanning radio receivers which are useful for receiving and scanning both amplitude modulated and frequency modulated signals and, more particularly, are useful for receiving and scanning signals on the frequencies designated by the United States Federal Communications Commission for the public safety and aircraft communication services. Circuitry is provided for generating a signal indicative of the type of modulation used on signals at the frequency to which the receiver is tuned at any instant and automatically changing the demodulation operation of the receiver between amplitude modulation and frequency modulation in response to that signal. A single circuit is also provided for generating the necessary squelch or control signal is response to both amplitude modulated and frequency modulated signals, and a single circuit is also provided for preventing mistuning of the receiver when tuned to frequencies having either amplitude modulated or frequency modulated signals thereon.

It is, therefore, an object of this invention to provide a scanning radio receiver useful for receiving both amplitude modulated and frequency modulated signals.

It is an object of this invention to provide a scanning radio receiver useful for receiving and scanning frequencies having signals thereon which may be amplitude modulated or frequency modulated wherein the amplitude modulated signal frequencies and the frequency modulated signal frequencies may be scanned in an intermixed and arbitrarily selected order.

It is an object of this invention to provide a scanning radio receiver useful for receiving and scanning frequencies allocated to both the public safety and aircraft communication radio services.

It is an object of this invention to provide a scanning radio receiver useful for receiving and scanning frequencies allocated to both the public safety and aircraft communication radio services wherein the public safety frequencies and the aircraft communication frequencies may be scanned in an intermixed and arbitrarily selected order.

It is an object of this invention to provide a scanning radio receiving useful for receiving and scanning frequencies having signals thereon which may be amplitude modulated or frequency modulated and which includes circuitry for automatically altering the demodulation operation of the receiver dependent upon the type of modulation used at the frequency to which the receiver is tuned at any instant.

It is an object of this invention to provide a scanning radio receiver useful for receiving and scanning frequencies having signals thereon which may be amplitude modulated or frequency modulated and which includes circuitry for generating at least one control signal responsive to the form of modulation included on signals at the frequency to which the receiver is tuned at any instant and circuitry responsive to that control signal for altering the demodulation operation of the receiver.

It is an object of this invention to provide a scanning radio receiver useful for receiving and scanning frequencies having signals thereon which may be amplitude modulated or frequency modulated and which includes a single circuit for developing the necessary squelch or control signals regardless of the form of modulation used on the received signal.

It is an object of this invention to provide scanning radio receivers having signal search capabilities and useful for receiving and scanning frequencies having signals thereon which may be amplitude or frequency modulated and which includes a single circuit for preventing mistuning of the receiver during a search operation regardless of the form of modulation on the received signal.

It is an object of this invention to provide a scanning radio receiver useful for receiving and scanning frequencies allocated on both the public safety and aircraft communication services which is characterized by economy of construction consistent with a high level of performance.

Further and additional object of this invention will be apparent from this description, the appended claims, and drawing.

BRIEF DESCRIPTION OF THE DRAWINGS

FIG. 4 is a schematic block diagram of the circuitry of the receiver of FIG. 1;

FIGS. 11 through 22 provide flow charts respectively showing key action routines which take place following operation of a manual key, a scan key, a search key, a marine key, an aircraft key, a priority key, numeric keys, an enter key, a limit/hold key, band keys, a lock out key and a delay key;

FIG. 28 provides a flow chart illustrating a load future routine used in conjunction with service searches with the processor circuitry illustrated in FIG. 25;

FIG. 29 provides a flow chart illustrating a routine followed by the processor circuit of FIG. 25 in conjunction with a police service search; and FIG. 30 provides a flow chart illustrating a routine followed in connection with a high band key action routine of the processor circuitry of FIG. 25.

DESCRIPTION OF A PREFERRED EMBODIMENT

Figure 1:
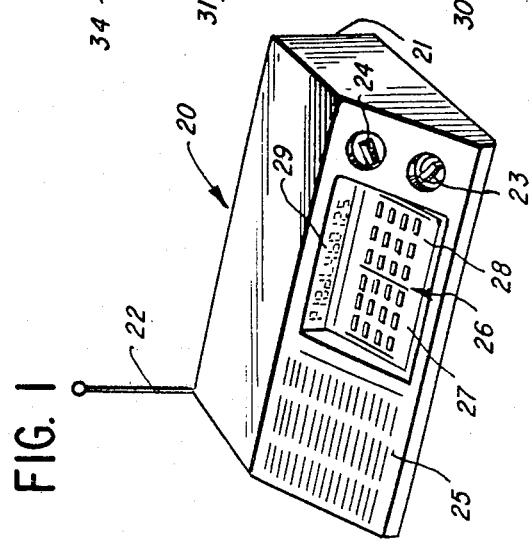
FIG. 1 is a perspective view of a scanning radio receiver constructed in accordance with the invention.

Reference 20 generally designates a scanning receiver constructed in accordance with the principles of this invention. The receiver 20 as shown in FIG. 1 may include a cabinet 21 having a telescopic antenna 22 projecting therefrom, having volume and squelch control knobs 23 and 24 on a front inclined face thereof, and having a grill portion 25 behind which a speaker is mounted.

The operation of the receiver 20 is controlled from a keyboard 26 which includes a left-hand program section 27 including numeric keys for entering in frequencies to be received and a right-hand operation section 28 including keys for effecting manual and various automatic control functions. In addition, the receiver 20 includes a display 29 for indicating the frequency to which the receiver is tuned and for indicating the status of various channels and control functions of the receiver.

In a typical operation of the receiver 20, it may be tuned to a certain frequency as indicated by the display 29. In a manual mode of operation, or when a "hold" feature is selected, the receiver will remain tuned to that frequency indefinitely. The receiver will also perform an automatic scanning operation in which it senses the termination of a signal and then automatically tunes itself to a new frequency. If no signal is sensed at the new frequency within a certain time interval, the receiver then automatically tunes to another new frequency, continuing until a frequency is found at which a signal is received.

The frequencies to which the receiver tunes itself are controllable by entering selected frequencies into a memory, using the program section 27 of the keyboard 26, or the receiver may search between selected frequency limits or the receiver may scan through frequencies designated by the Federal Communications Commission for marine or aircraft use.

Figure 2:
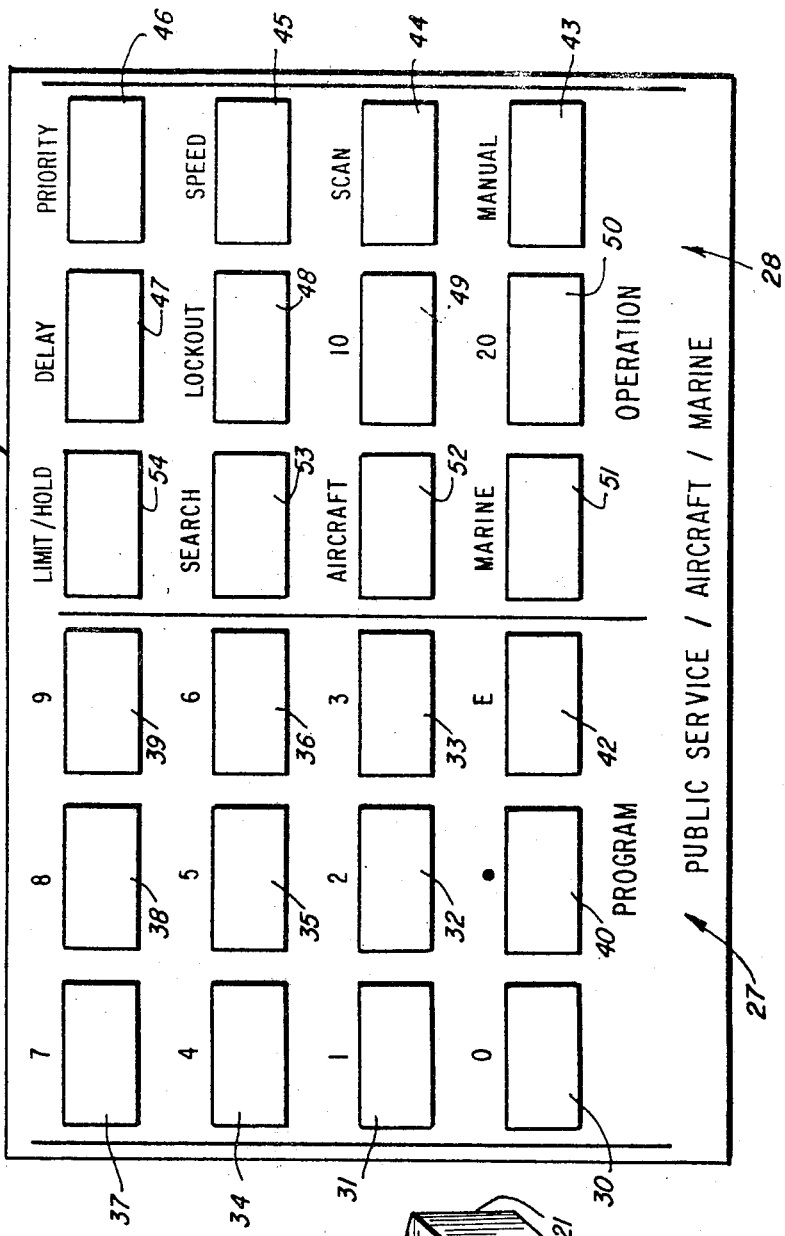
FIG. 2 is a plan view of a keyboard of the radio of FIG. 1.

FIG. 2 shows the arrangement of the keyboard 26 in which the program section 27 includes 10 numeric keys respectively designated by reference numerals 30–39 and operative for signaling the digits 0 through 9. The program section 27 further includes a decimal key 40 and a key 42 labeled "E" and operative for effecting entry of frequency selected through the use of the numeric keys 30–39 and decimal point key 40.

The operation section 28 includes twelve keys for obtaining various operations. A "MANUAL" key 43 is operable for stopping a scanning or searching operation and for stepping the receiver through all of its channels, the illustrated receiver having twenty channels.

A "SCAN" key 44 is usable for initiating the scanning of all channels. A speed key 45 is operable for selecting between slow and fast scan or search rates which may be four or eleven channels per second, respectively.

A "PRIORITY" key 46 is operable to cause the receiver to switch to one channel such as Channel 1 periodically, for example, every two seconds, regardless of any other signals.

A "DELAY" key 47 is usable to interpose a predetermined delay between the end of a transmission on one channel and the initiation of a scan or search for a new frequency, this key being usable primarily for allowing monitoring of two-way conversations.

A "LOCK-OUT" key 48 is operable for locking out one or more channels during a scanning operation.

Keys 49 and 50, respectively labeled as "10" and "20" keys, are provided for control of the inclusion or exclusion of either of two banks of ten channels each in the scanning operation.

A "MARINE" key 51 is provided for effecting the automatic scanning of signals in a band designated by the Federal Communications Commission for marine use and an "AIRCRAFT" key 52 is provided for effecting an automatic scanning of frequencies designated by the Federal Communications Commission for aircraft use.

A "SEARCH" key 53 is provided for initiating a searching between certain frequencies which may be pre-selected through the use of the keyboard section 27 and a "LIMIT-HOLD" key 54. In addition to being usable to enter the search frequency limits, the key 54 is usable to hold the frequency of tuning at a frequency to which the receiver is tuned when the key 54 is depressed.

Figure 3:
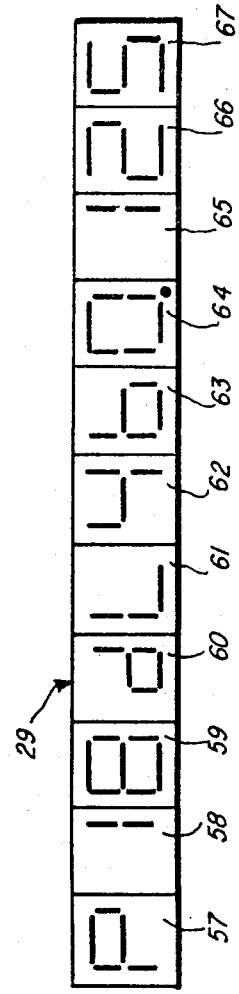
FIG. 3 is a plan view of a display of the receiver of FIG. 1, illustrating indications obtained in a certain condition of operation.

The operations of all of the keys and also the operation of the display 29 are described in more detail hereinafter in connection with a description of the operation of the control circuitry of the receiver. It is here noted, however, that the display 29 includes eleven spaces or "windows" indicated by reference numerals 57–67. The first five spaces 57–61 are used for indicating the status of priority and other controls as well as the number of the channel being received, while the last six spaces indicate the frequency to which the receiver is tuned. In the condition of the display 29 as illustrated in FIG. 3, the receiver is tuned to 460.125 MHz, the receiver is operated on channel 18 as indicated in the second and third windows 58 and 59, the channel has priority status as indicated by the letter "P" in window 57, a delay operation is in effect as to the selected frequency as indicated by the letter "d" in window 60 and the lock-out function is effective as to the selected channel as indicated by the letter "L" in the window 61.

The receiver 20 has circuitry such that it accurately tunes itself to any one of a very large number of frequencies and rapidly scans groups of frequencies selected by the user, responding only to signals of possible interest to the user. With respect to the frequencies covered, the receiver may cover the "Low" and "High" VHF bands and the UHF band which are designated for public service use by the FCC (United States Federal Communications Commission), respectively extending from 30–50 MHz, 148–174 MHz and 450–470 MHz. The maritime band from 156.275 to 162.000 MHz controlled by the "MARINE" key 51 is included within the "High" VHF band. In addition, the receiver covers a band designated by the FCC for aircraft use, extending from 118 to 136 MHz and a band from 144 to 148 MHz which includes the 2-meter amateur band.

The receiver also covers UHF frequencies from 420.5 to 450 MHz including an amateur band from 442.050 to 444.950 and UHF frequencies from 470 to 512 MHz designated as a television or "T" band. For convenience, "L" is used herein to designate the frequency range or band from 30 to 50 MHz, "A" designates an aircraft band from 118 to 136 MHz, "H" designates a VHF band from 144 to 174 MHz and "UHF" designates a band from 420.5 to 512 MHz.

Specific features of the receiver relate to arrangements such that the FCC requirements with respect to modes of modulation and frequency spacings between adjacent channels are taken into account, to obtain efficient and reliable reception while minimizing the complexity of the receiver.

FIG. 4 is a schematic block diagram of the circuitry of the receiver 20. A receiver 20 has three principal portions. The first is an RF portion generally indicated by reference numeral 70 which is controlled from oscillator and frequency synthesizer circuits 71 to develop from any signal on antenna 22 which is a selected frequency channel, a 10.8 MHz IF signal on a line 72. Also, a 10.4 MHz reference signal is developed on an output line 73 from the oscillator and frequency synthesizer circuits 71.

The second principal portion of the receiver includes mixer, amplifier and detector circuits 75 which respond to the 10.8 MHz IF signal on line 72 and the 10.4 MHz reference signal on line 73, used as a second local oscillator signal, to develop an audio output signal applied through a line 76 and through a mute circuit 77 and an audio amplifier circuit 78 to a speaker 80. The mixer, amplifier and detector circuits 75 include a squelch circuit which controls operation to cause an audio output signal to be developed only when a received signal of above a certain strength is received. The squelch circuit also develops a control signal on a line 81 for signaling the absence of a received signal such as to cause scanning to continue when a scanning mode of operation is selected.

The mixer, amplifier and detector circuits 75 include demodulators for both FM and AM reception and an A-band control signal is applied thereto through a line 82 to condition the circuits for AM reception which is required in the "A" or aircraft band from 118 to 136 MHz.

Additional functions of the circuits 75 include a generation of an AGC or automatic gain control signal on a line 83 and a signal on a line 84 for control of tuning in the RF portion 70 of the receiver.

Figure 8:
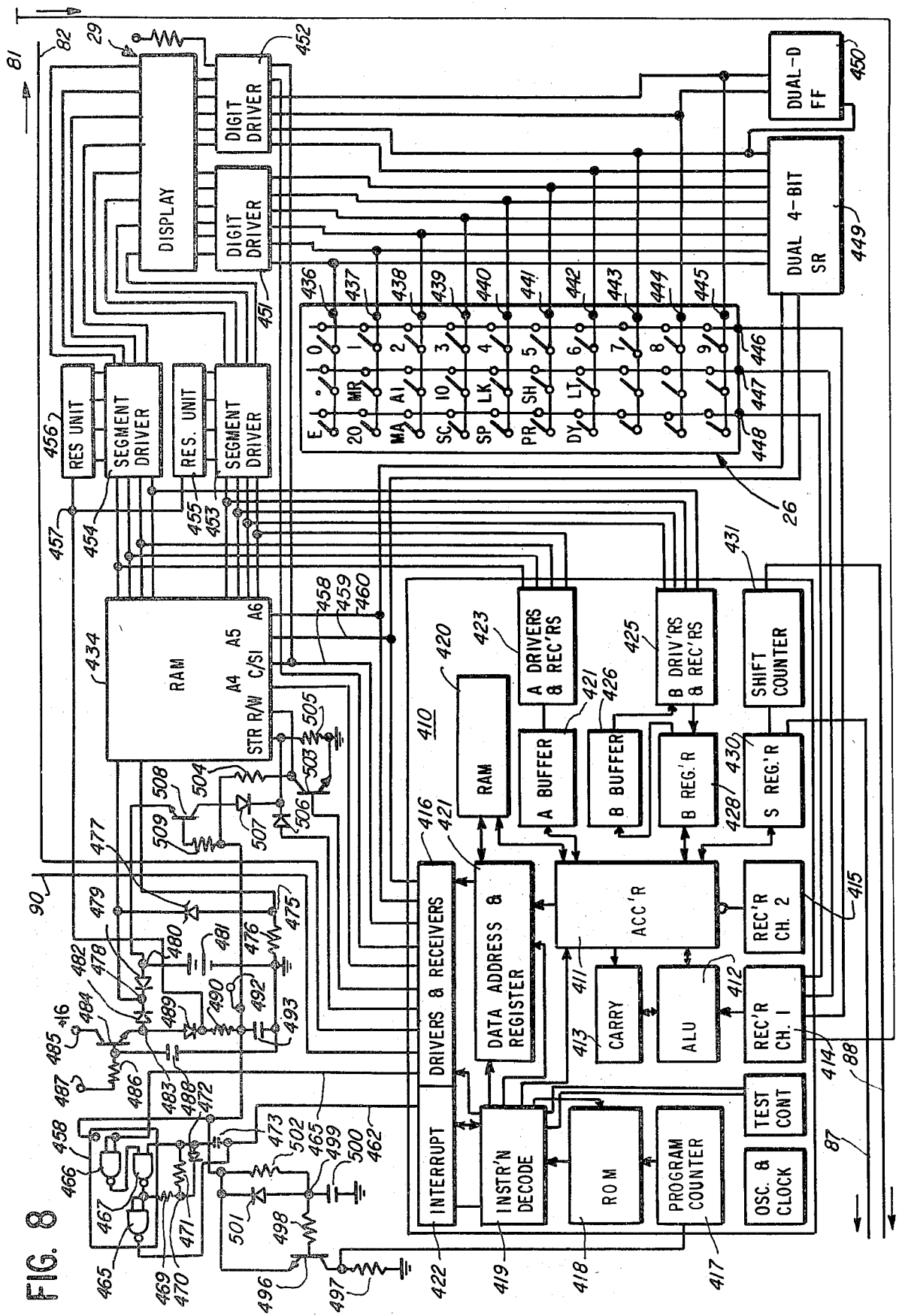
FIG. 8 is a schematic diagram of one form of keyboard display and processor circuits usable in the receiver and shown in block form in FIG. 4.

The third principal portion of the receiver 20 is a control portion and includes keyboard, display and processor circuits 86. To control the frequency of tuning of the RF portion, such circuits operate to supply data signals which are applied through a line 87 to the oscillator and frequency synthesizer circuits 71 along with clock signals applied through a line 88. In addition, the circuits 86 develop a mute signal on a line 90, applied to the mute circuit 77 to silence the receiver during certain conditions of operation such as during switching from one channel to another. The circuits also develop the "A" band control signal on line 82. Circuits 86, of course, respond to the signals applied from operation of the various keys of the keyboard and, during a scanning operation, the circuits 86 respond to the control or squelch signal applied thereto through the line 81. It is noted that although not used in the circuits as illustrated in FIG. 8, a master clock signal at a frequency of 433 KHz may be applied from circuits 71 and through line 91 to the circuits 86 for possible usuage for clock purposes.

Another 433 KHz signal may be applied from circuits 71 and through a line 92 to a power supply circuit 94 in which the signal is divided down to a 25 KHz signal which is amplified and rectified to produce a 25 volt supply voltage on a line 95, the circuit 94 may be connected to a battery supply and/or a line cord 95 and develops various other DC supply voltages such as 5 volts, 9 volts and 11.4 volts on lines 97-99, respectively.

With respect to the RF portion 70, signals from the antenna 22 are applied to the input of a limit circuit 101 which may include diodes operative to prevent overload of the receiver from extremely strong signals and which may also include an inductor for attenuating frequencies below the H-band and to also provide an improved impedance match. The output of the limit circuit 101 is applied directly to the input of an RF amplifier circuit 102 for the UHF band (420-512 MHz) and through a coupling circuit 103 to the input of another RF amplifier 104 for the L, A and H bands (30-50, 118-136 and 144-174 MHz). The outputs of the RF amplifiers 102 and 104 are applied to inputs of UHF band and L, A and H band mixer circuits 105 and 106 which have outputs connected through lines 107 and 108 to inputs of a 10.8 MHz IF amplifier 110 connected to the line 72.

To develop a 10.8 MHz signal on the output line 107, the UHF band mixer circuit 105 is supplied with a signal which has a frequency 10.8 MHz lower than that of the signal to be received, the signal being thus variable in frequency over a range from 409.7 MHz to 501.2 MHz. To develop the signal for application to the mixer circuit 105, a voltage controlled oscillator 112 is operated in a lower frequency range and its output is connected through a line 113 to the input of a frequency tripler 114, the output of the frequency tripler 114 being applied through line 115 to the mixer circuit 105. Thus, to develop the local oscillator signal for reception in the 420.5-512 MHz UHF band, the voltage controlled oscillator 112 may be operated in a frequency range from 136.567 to 167.067 MHz.

The L, A and H band mixer circuit 106 is directly connected to the output line 113 of the voltage controlled oscillator. For operation in the L band from 30 to 50 MHz, and also for operation in the A-band from 118 to 136 MHz, the oscillator frequency is preferably above the desired signal frequency while for operation in the H band from 144 to 174 MHz, the oscillator frequency is below the desired signal frequency. Thus, for operation in the L, A and H bands, the voltage controlled oscillator 113 may supply signals in the ranges from 40.8 to 60.8 MHz, 128.8 to 146.8 MHz and 133.2 to 163.2 MHz.

For control of the frequency of operation of the voltage controlled oscillator 112, it has a second output which supplies a signal at its operating frequency through a line 116 to the oscillator and frequency synthesizer circuits 71. Circuits 71 respond to the signal so applied to develop a DC output signal on a line 117 which is applied to the oscillator 112 to maintain the output frequency of the oscillator 112 at a certain value determined by input data supplied to circuits 71 through line 87 from the keyboard, display and processor circuits 86.

The DC output signal on line 117 is also applied to a track-tuning circuit 118 which develops a corresponding DC control voltage on a line 120 which is connected to the RF amplifiers 102 and 104 and also to the frequency tripler 114, to control the tuning of tuned circuits therein, voltage-controlled capacitors being preferably provided in the circuits 102, 104 and 114 for this purpose.

The track-tuning circuit 118 is controlled from the A-band control signal on line 84 and is additionally controlled from control signals applied through lines 121 and 122 from the circuits 71 in accordance with input data supplied through line 87 from the keyboard, display and processor circuits 86. The signals on lines 121 and 122 are referred to herein as UHF and OSC signals, respectively. The UHF signal is developed during operation in the UHF band and the OSC signal is developed during operation in the A, H and UHF bands. Thus, the track-tuning circuit 118 responds to the variable DC control signal on line 117 and to the A-band, UHF and OSC control signals on lines 84, 121 and 122 to develop the DC control voltage on line 120 which is appropriate for control of the circuits 102, 104 and 114 according to the existent conditions of operation.

The UHF control signal on line 121 is also applied to the RF amplifiers 102 and 104 and operates to disable the UHF amplifier 102 during L, A and H band operation and to disable the L, A and H band amplifier 104 during UHF operation.

The OSC control signal on line 122 is also applied through a resistor 124 to the L, A and H band amplifier 104 and it operates to short out an inductor of the amplifier 104 to change its timing during operation in the A and H bands.

Figure 5:
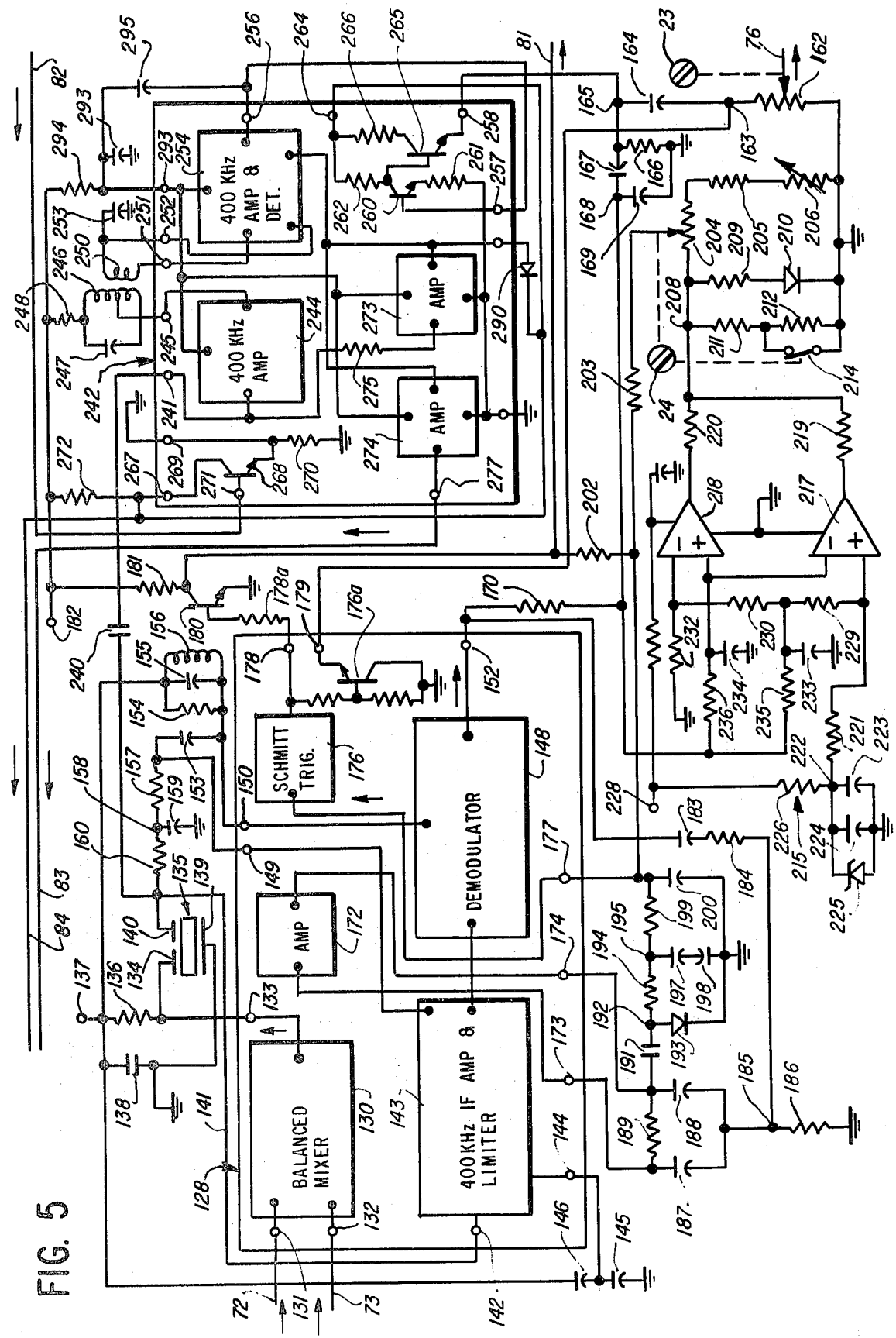
FIG. 5 is a circuit diagram of mixer, amplifier and detector circuits shown in block form in FIG. 4.

FIG. 5 is a circuit diagram of the mixer, amplifier, and the detector circuits 75. As aforementioned, the circuits 75 respond to a 10.8 MHz signal on line 72, derived from the output of the IF amplifier 110, and to a 10.4 MHz reference signal applied through line 73 and develop an output audio signal on line 76. In addition, the circuits 75 develop a control signal on line 81 for control of the processor circuits 86 to effect stepping to a new channel in a scanning or searching operation. The A-band control signal is applied through line 82 to condition the circuits for AM reception which is required in the "A" or aircraft band from 118 to 136 MHz. The circuits 75 also develop an AGC signal on line 83 and a control signal on line 84 which is applied to the track-tuning circuit. The 10.8 and 10.4 signals on lines 72 and 73 are mixed to develop a 400 KHz IF signal which is amplified and demodulated for either FM or AM reception. It is also a feature of the invention that the same circuits are operative for squelch function in both FM and AM reception. Additional features relate to the circuitry for switching between FM and AM reception without affecting the squelch and interference elimination functions.

As shown in FIG. 5, an integrated circuit 128 is provided which includes a balanced mixer circuit 130 having input terminals 131 and 132 of which are connected to the lines 72 and 73, an output terminal of the mixer 130 being connected to a pin or terminal 133 of the circuit 128. The balanced mixer 130 responds to the 10.8 and 10.4 MHz signals applied through lines 72 and 73 to develop a 400 KHz second IF signal on terminal 133 which is applied to one electrode 134 of a ceramic filter 135. Terminal 134 is also connected through a resistor 136 to a +5 volt power supply terminal 137, a by-pass capacitor 138 being connected between terminal 137 and ground. The ceramic filter 135 includes a second grounded electrode 139 and a third electrode 140. The third electrode 140 forms an output electrode which is coupled to inputs of 400 KHz second IF amplifier and detector circuits for both FM and AM reception.

For FM reception and for performing squelch and control functions, electrode 140 is connected through a line 141 to a terminal 142 of the integrated circuit 128, terminal 142 being connected to the input of a 400 KHz second IF amplifier and limiter circuit 143.

The amplifier and limter 143 includes a terminal connected to a terminal 144 of the integrated circuit 128 which is connected through a capacitor 145 to ground and through a capacitor 146 to the +5 volt power supply terminal 137. An output terminal of the amplifier and limiter circuit 143 is connected within the integrated circuit 128 to an input terminal of a demodulator circuit 148. Terminals of the circuits 143 and 148 are connected to terminals 149 and 150 of the circuit 128. An output terminal of circuit 148 connected to a terminal 152, the terminal 152 being an audio output terminal of the circuit 128.

Terminals 149 and 150 are connected to circuitry for providing the proper phase shift to balance the circuits. As shown, terminal 149 is connected through a capacitor 153 to the terminal 150 which is connected to the power supply terminal 137 through the parallel combination of a resistor 154, a capacitor 155, and an inductor 156. Terminal 149 is also connected through a resistor 157 to a circuit point 158 which is connected through a capacitor 159 to ground and through a resistor 160 to the electrode 140 of the ceramic filter 135.

The audio output terminal 152 of the integrated circuit 128 is coupled to the audio output line 76. As shown, the output line 76 is connected to the movable contact of a potentiometer 162, one end terminal, of which is grounded with the other end terminal thereof being connected to a circuit point 163. The circuit point 163 is connected through a capacitor 164 to a circuit point 165 which is connected through a resistor 166 to ground and which is connected through another capacitor 167 to a circuit point 168 connected through a capacitor 169 to ground and through a resistor 170 to the output terminal 152 of the integrated circuit 128 which includes the FM demodulator circuit 148.

Audio signals developed from demodulation of the FM signals are coupled through resistor 170 and capacitors 167 and 164 to the circuit point 163, a portion of the signal so applied being applied to the output line 76 dependent upon the position of the movable contact of the potentiometer 162 which is mechanically coupled to the volume control knob 23. As hereinafter described, an audio output signal from AM detector portions of the circuit are applied to the circuit point 165 and the circuit arrangement is such that the transmission of the audio signal from the output of the FM demodulator circuit 148 is attenuated when the audio output from the AM detector portion is applied.

The output terminal 152 of the circuit 128 is also coupled to circuitry for performing squelch and control functions during both AM and FM reception. The squelch circuitry includes an operational amplifier 172 of the integrated circuit 128 having input and output terminals connected to terminals 173 and 174, and further includes a Schmitt trigger circuit 176 having input and output terminals connected to terminals 177 and 178.

The output of trigger circuit 176 is connected to the terminal 178 and also through a voltage divider to the base of a transistor 176a within the integrated circuit 128, the collector of transistor 176a being grounded and the emitter thereof being connected to a terminal 179. Terminal 178 is connected through a resistor 178a to the base of a transistor 180 having a grounded emitter and having a collector connected to the scanning control signal output line 81 and also through a resistor 181 to a +9 volt power supply terminal 182.

The amplifier terminals 173, 174 and 177 are connected to external circuitry which operates in a manner such that when no transmission is being received and when noise components in a 8 KHz audio frequency range are of high magnitudes, the terminal 178 is at a high level and the scanning control signal output line 81 is at a low level, permitting the receiver to scan. At the same time, the terminal 179 will be at a low level, shutting off the audio at the volume control potentiometer 162.

The external circuitry of the squelch circuit includes a capacitor 183 and a resistor 184 connected in series between the terminal 152 and a circuit point 185 which is connected through a resistor 186 to ground and which is connected through capacitors 187 and 188 to the input and output terminals 173 and 174 for the amplifier 172, a resistor 189 being connected between the terminals 173 and 174. The output terminal 174 for the amplifier 172 is connected through a capacitor 191 to a circuit point 192 which is connected through a diode 193 to ground. Circuit point 192 is connected through a resistor 194 to a circuit point 195 which is connected through a pair of capacitors 197 and 198 to ground. Circuit point 195 is connected through a resistor 199 to the terminal 177 which is connected through a capacitor 200 to ground.

The resonant frequency (preferably about 8 KHz), the Q, and the gain are determined by capacitors 187 and 188 and the resistors 184, 186, and 189. It is necessary to shape the noise power pass band so that normal audio frequencies do not activate the squelch system. The high frequency noise which is amplified by the amplifier 172 and is coupled through capacitor 191 and detected by 193 to produce a negative voltage which is filtered by resistor 194 and capacitors 197 and 198. The two capacitors 197 and 198 are provided and connected in back-to-back relation, as shown, because the voltage swings both positive and negative. The detector negative voltage developed at circuit point 195 is applied through resistor 199 to the terminal 177 which is connected to the input of Schmitt trigger 176 and which is also connected to squelch control circuitry operative to supply a positive bias. When such a bias is overcome by the output from the noise detector circuitry, the trigger circuit 176 is operative to develop a high output signal at the terminal 178 which operates through the transistor 180 to prevent transmission of an audio signal, as above described. It is noted that the collector of transistor 180 may be connected through a resistor 202 to the terminal 177 for the purpose of providing additional squelch hysteresis.

To control the bias level at the terminal 177 and thereby control the squelch level, terminal 177 is connected through a resistor 203 to the movable contact of a potentiometer 204 forming the squelch control, the movably contact being mechanically coupled to the squelch control knob 24 (FIG. 1).

One terminal of the squelch potentiometer 204 is connected through a fixed resistor 205 and an adjustable trim resistor 206 to ground. The other terminal of the potentiometer 204 is connected to a circuit point 208 which is connected through a resistor 209 and a diode 210 to ground and also through resistors 211 and 212 to ground, a switch 214 being connected in parallel with a resistor 212. Switch 214 is mechanically coupled to the squelch control knob 24, and when the knob 24 is at its extreme counter-clockwise position, switch 214 is open while the movable contact of potentiometer 204 is to the right, as viewed in the drawing. A predetermined squelch level is thus obtained which is satisfactory for most operations.

The circuit point 208 is additionally connected to the output of a circuit generally designated by reference numeral 215, and which is referred to as a window detector, being operative to allow development of an output audito signal only when a received signal is within certain frequency limits defining the received frequency channel and being operative to prevent unsquelching of the audio by a strong interfering signal which is not in a desired channel.

The window detector circuit 215 includes two operational amplifiers 217 and 218 having outputs connected through resistors 219 and 220 to the circuit point 208. The plus input of the amplifier 217 is connected through a resistor 221 to a circuit point 222 which is connected to ground through the parallel combination of a pair of capacitors 223 and 224 and a zener diode 225, circuit point 222 being also connected through a resistor 226 to a +9 volt power supply terminal 228. The plus input of amplifier 217 is also connected through resistors 229 and 230 to the minus input of amplifier 218 which is connected through a resistor 232 to ground. The junction between resistors 229 and 230 and a connection between the minus input of amplifier 217 and the plus input of amplifier 218 are connected through capacitors 233 and 234 to ground and also through resistors 235 and 236 to a junction which is connected directly to the circuit point 168, connected through resistor 170 to the output terminal 152 of the limiter and demodulator circuit 148.

With regard to the operation of the circuit, the output voltage at the terminal 152 has a "S" curve characteristic as a function of frequency such as conventionally obtained with FM demodulator circuits. It may, for example, have a certain DC potential when the input frequency is 400 KHz, gradually increasing to a certain higher potential as the frequency is decreased to approximately the lower limit of the frequency channel to be received and gradually decreasing as the frequency increases to approximately the upper limit of the frequency channel to be received. The zener diode 225 and associated components establish a certain fixed voltage at the circuit point 222 and the resistors 221, 229, 230, and 232 establish certain upper and lower voltage limits at the plus input of amplifier 217 and the minus input of amplifier 218. The resistors 229 and 230 preferably have substantially equal values, and the junction therebetween is at a level approximately midway between such upper and lower voltage limits.

The capacitors 233 and 234 remove AC components, and if the DC component of the output voltage applied from terminal 152 through resistor 170 and through resistor 236 to the connection between the minus input of amplifier 217 and the plus input of amplifier 218 is above the upper limit or below the lower limit, the output of amplifier 217 or amplifier 218 will go low which will reduce the voltage at the circuit point 208. Through potentiometer 204 and resistor 203, the voltage at the terminal 177 will be reduced to force the output at terminal 178 to go high, while the output at terminal 179 will go low. Thus, the receiver will continue scanning, if in the scan mode, and the audio will be squelched.

However, if the DC component of the output voltage of the limiter and demodulator circuit 148 is such that the voltage at the junction between the minus input of amplifier 217 and the plus input of amplifier 218 is within the window limits, the outputs of both amplifiers 217 and 218 will be high. During such operation, the bias level at terminal 177 is controlled by the squelch control potentiometer 204.

As aforementioned, when the squelch control knob 24 is turned all the way counter-clockwise, the movable contact of potentiometer 204 is at the righthand end as viewed in the drawing and the switch 214 is opened thereby removing the short across the resistor 212. Under such conditions, a voltage level is established at the terminal 177 which is appropriate for normal operation. Thus, the squelch control knob 24 may be normally positioned in a counter-clockwise position at which the switch 214 is open and need be used only under conditions in which the user finds it desirable to control the squelch level.

For AM reception, the 400 KHz signal at the electrode 140 of the ceramic filter 135 is applied through a capacitor 240 to a terminal 241 of an integrated circuit 242. An amplifier 244 is provided within the integrated circuit 242 which has an input connected to the terminal 241 and which has an output connected to a terminal 245. The amplifier 244 operates in conjunction with external components to provide a tuned amplifier stage operative at 400 KHz, the terminal 245 being connected to a tap on an inductor 246 which is connected in parallel with a capacitor 247, one terminal being connected through a resistor 248 to the +9 volt power supply terminal 182. The inductor 246 forms a primary winding of a transformer having a secondary winding 250 which is connected to terminals 251 and 252 of the integrated circuit 242, terminal 252 being connected through a capacitor 253 to ground. The terminals 251 and 252 are connected to terminals of the circuit 254 within the integrated circuit 242, circuit 254 forming a second 400 KHz amplifier stage and a detector stage which develops an audio output signal at a terminal 256 in response to amplitude variations in the amplified 400 KHz signal.

The detector output signal developed at the terminal 256 is applied to a terminal 257 of the circuit 242 to be amplified by an amplifier within the circuit 242 having an output connected to a terminal 258 which is connected to the circuit point 165 coupled through the capacitor 164 to the circuit point 163 and the ungrounded end of the volume control potentiometer 162.

The amplifier so provided within the circuit 242 is so controlled as to be operative only when an A-band control signal is applied through line 82 and is also such as to provide a very low output impedance which precludes transmission of audio signals from the FM demodulator portion of the circuitry when the AM portion is conditioned for operation.

The amplifier circuit so provided includes a transistor 260 having an emitter connected through a resistor 261 to ground and having a collector connected through a resistor 262 to a terminal 264 and also connected to the base of a transistor 265 having an emitter connected to the terminal 258 and having a collector connected through a resistor 266 to the terminal 264. Terminal 264 is connected to another terminal 267 of the integrated circuit 242 which is connected to the collector of a transistor 268 within the circuit 242. The emitter of the transistor 268 is connected to a terminal 269 which is connected to an external ground, resistor 270 which is connected between the emitter and an internal ground being short-circuited and being unused.

The base of the transistor 268 is connected to a terminal 271 which is connected to the line 82, and when a high-level control signal is applied through 82 to the base of the transistor 268, the transistor 268 is conductive, clamping the potential of the terminal 264 at a low level to preclude operation of the amplifier circuit which includes transistors 260 and 265.

However, when the control signal on line 82 is at a low level, the transistor 268 is cut off and the voltage at the terminals 264 and 267 may rise to a high level, such terminals being connected to the +9 volt power supply terminal 182 through a resistor 272 having a relatively low ohmic value.

With a relatively high operating voltage being thus applied at terminal 264, the amplifier, including transistors 260 and 265 may operate to amplify the audio output from the terminal 256 and to apply an amplified signal from terminal 258 and through capacitor 164 to the circuit point 163 at the ungrounded end of the volume control potentiometer 162. It is noted that the transistor 165 operates as an emitter-follower and has a low output impedance such as to attenuate transmission of a signal from the output terminal 152 of the FM portion of the circuit.

The integrated circuit 242 further includes circuits for automatic gain control including a pair of amplifiers 273 and 274 having inputs connected within the circuit 242 to an output terminal of the circuit 254 which is separate from the terminal connected to the output terminal 256. The output of the amplifier 273 is applied through a resistor 275 to the input of the amplifier stage 244 to control the bias level thereof and to thereby control its gain. The output of the amplifier 274 is connected to a terminal 277 which is connected to the line 83 connected to the 10.8 MHz IF amplifier 110, as shown in FIG. 4.

During AM reception, the voltage applied through 83 is varied in a manner to control the bias of the 10.8 MHz IF amplifier 110, and to thereby control its gain. It is noted that, as shown in FIG. 4, a diode 278 may be included between the line 83 and the amplifier 110, operative to provide a constant voltage drop which may be 1.7 volts, for example, for providing the proper gain adjustment for the aircraft band. During FM operation, the output level on the line 83 is held high. For this purpose, a terminal 289, which is connected to the input of amplifier 274, is connected through a diode 290 to the terminal 267 which is clamped close to ground potential by transistor 268 during FM operation. A capacitor 291 is connected between terminal 289 and ground.

A voltage supply terminal 292 is connected through a capacitor 293 to ground and through a resistor 294 to the +9 volt supply terminal 182. A capacitor 295 may be connected between terminal 292 and the detector output terminal 256.

With respect to the automatic gain control operation during AM reception, the line 83 is additionally connected to the RF amplifier 104 for the L, A and H band operation.

It is further noted that the line 84, which is connected to the track-tuning circuit 118, is connected to the terminal 267 which is connected to the collector of the transistor 268 operative as a switching transistor for A-band operation. Thus, the transistor 268 additionally functions to control application of a control voltage for the track-tuning circuit 118.

Figure 6:
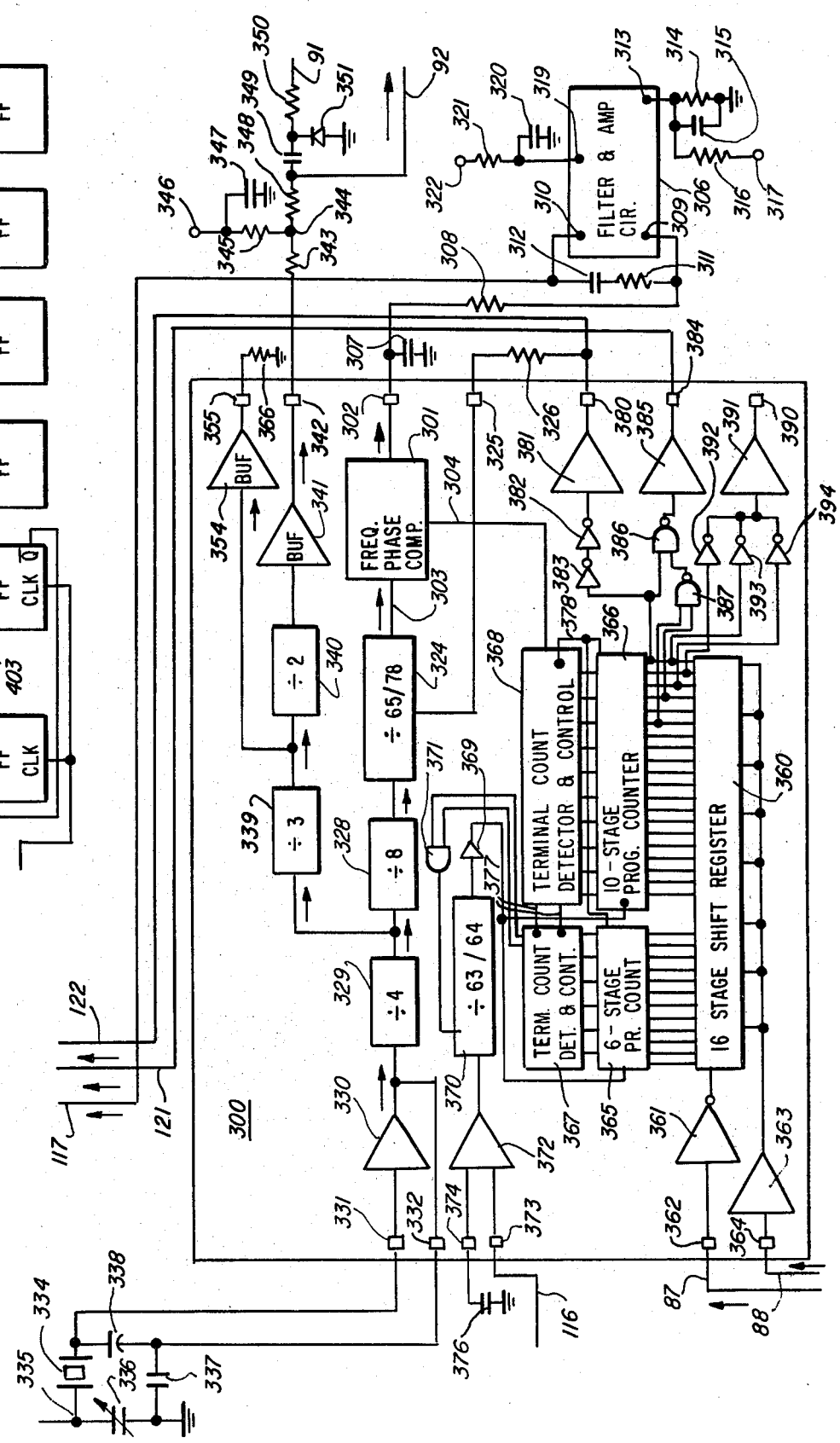
FIG. 6 is a schematic circuit diagram of oscillator and frequency synthesizer circuits shown in block form in FIG. 4.

FIG. 6 shows the circuitry of the oscillator and frequency synthesizer circuits 71. As aforementioned, the circuits operate to supply a 10.4 MHz signal on line 73, applied to the mixer, amplifier, and detector circuits 75. The circuits 71 also respond to data and clock signals supplied through lines 87 and 88 from the processor circuits 86 while also responding to a signal on line 116 at the oscillator frequency to develop a DC control signal on line 117 for control of the voltage-controlled oscillator. The voltage so applied is such as to maintain the frequency of the signal on line 116 at a value corresponding to the input data supplied through line 87.

The circuits 71 also supply 433 KHz clock signals through lines 91 and 92 to the processor circuits 86 and power supply circuit 94. In addition, the data supplied through line 87 is decoded in a manner such as to develop the UHF and OSC control signals on lines 121 and 122 for selective control of the RF amplifiers 102 and 104, and for control of the track-tuning circuit 118.

An important feature of the circuits relates to the provision of an integrated circuit 300 which provides reference, counting, band switching, and phase detector functions on a single chip. The circuit 300 has a frequency response which is good to a frequency of at least 175 MHz, and it responds directly to the signal on line 116 which is at the frequency of the oscillator 112. Unlike prior circuits, no mixing is required to shift the frequency of the signal on line 116 down to a frequency which may be utilized by the following digital activity.

In addition, the circuit 300 responds to input data which is clocked in serially from the processor circuits 86. As a result of these features, interference from internally generated signals generally referred to as "birdies", is substantially reduced. This feature is very important in a scanner radio because internally generated interfering signals can cause the scanning operation to stop and thereby prevent the receiver from performing its intended functions.

The integrated circuit 300 includes a frequency-phase comparator circuit 301 which develops a control signal on a line 302 corresponding to the difference in frequency or phase between a fixed frequency reference signal applied on a line 303 and a variable frequency signal applied on a line 304. The fixed frequency reference signal on line 303 is developed by counting down from a 10.4 MHz oscillator signal. The variable frequency signal on line 304 is developed by counting down from an oscillator signal applied on line 116 according to a division ratio corresponding to the input data from the processor circuits 86. During operation in the L, A and H bands, the frequency of the reference signal on line 303 is 5 KHz while during operation in the UHF band, it is 4.1667 KHz.

The output developed at terminal 302 is a tri-state output. It goes low when the frequency of the voltage-controlled oscillator 112, applied on line 116, is lower than the programmed frequency, and when the frequency of a signal on line 304 is thereby less than that of the reference signal on line 303. It goes high when the signal on line 304 has a frequency higher than that of the reference signal on line 303. When the signals applied on lines 303 and 304 are in phase, the comparator circuit 301 provides a high impedance to the output terminal 302.

For control of the frequency of the oscillator, the comparator output terminal 302 is connected through a filter and amplifier circuit 306 to the output line 117 which is connected to the voltage-controlled oscillator 112. The terminal 302 is connected through a capacitor 307 to ground and through a resistor 308 to an input terminal 309 of the filter and amplifier circuit 306. An output terminal 310 of the circuit 306 is connected through the line 117 and a resistor 311 and a capacitor 312 are connected between the input and output terminals 311 and 312. The capacitor 307 operates to filter the tri-state output from the comparator circuit 301 and the signal is coupled through the resistor 308 to the terminal 309, which is an inverting input of the circuit 306.

If the voltage-controlled oscillator is running two low in frequency, negative correction pulses will go to the inverting input 307 forcing the output DC voltage terminal 310 to go higher. The capacitor 312 in the feed-back loop charges accordingly and holds the output at the new level.

In a similar manner, when the voltage-controlled oscillator is operating at too high a frequency, positive correction pulses from the comparator 301 will cause a decrease in the control voltage from the output of the circuit 306, tuning the voltage-controlled oscillator to a lower frequency until the divider output on line 304 is in phase with the reference signal on line 303 to stop the correction pulses.

When the voltage-controlled oscillator is on frequency and the comparator is a high impedance, the charge on the capacitor 312 will hold the control voltage keeping the voltage-controlled oscillator at that frequency.

The operation of the comparator circuit 301 is such that the width of a correction pulse is dependent upon the degree of phase difference so that the further that the voltage-controlled oscillator tends to go off frequency, the longer will be the pulse to correct it. By way of example, the output of the amplifier circuit 306 may be a DC voltage varying from about 0.5 volts to about 23 volts and, as aforementioned, it is used to adjust the track tuning, as well as to control the voltage-controlled oscillator.

It is noted that an input terminal 313 of the circuit 306 is supplied with a bias signal, being connected to ground through the parallel combination of a resistor 314 and a capacitor 315 and being connected through a resistor 316 to a +11 volt supply terminal 317. A supply voltage input terminal 319 for the circuit 306 is connected through a capacitor 320 to ground and through a resistor 321 to a +25 volt supply terminal 322.

The reference frequency signal on line 303, applied to one input of the frequency-phase comparator circuit 301, is developed at the output of a divider circuit 324, selectively operable as a divide-by-65 circuit or as a divide-by-78 circuit. A control input for the divider circuit 324 is connected to a terminal 325 of which is connected through a resistor 326 to the UHF control line 121, the control signal on line 121 being developed in a manner as hereinafter described.

The input of the divider circuit 324 is connected to the output of a divide-by-8 circuit 328, the input of which is connected to the output of a divide-by-4 circuit 329 having an input connected to the output of an amplifier 330. Input and output terminals of the amplifier 330 are connected to terminals 331 and 332 which are connected to external circuitry for providing an oscillator.

As shown, the amplifier input terminal 331 is connected to one terminal of a crystal 334, the other terminal of which is connected to circuit point 335 connected through a trim capacitor 336 to ground. The output terminal 332 is connected through a capacitor 337 to ground and through a capacitor 338 to the terminal 331. The circuit operates as a modified Colpitts oscillator to provide a 10.4 MHz oscillator signal at the output of the amplifier 330 which is applied to the input of the divide-by-4 circuit 329. The circuit also supplies a 10.4 MHz signal from circuit point 335 and through the line 73 to the circuits 75 to be mixed with the 10.8 MHz IF signal and to develop the 400 KHz second IF signals.

The circuitry is also used to develop the 433 KHz signals applied through lines 91 and 92 to the circuits 86 and 94. The output of the divide-by-4 circuit 329 is connected to the input of a divide-by-3 circuit 329 which is connected through a divide-by-2 stage 340 and a buffer stage 341 to an output terminal 342 of the integrated circuit 300. Terminal 342 is connected through a resistor 343 to a circuit point 344 connected through a resistor 345 to a +5 volt supply terminal 346 connected through a capacitor 347 to ground. Circuit point 344 is also connected through a resistor 348 to the line 92 which is connected through a capacitor 349 and a resistor 350 to the line 91, a diode 351 being connected between ground and the junction between capacitor 349 and resistor 350.

The circuit also includes a buffer stage 354 connected between the output of the divide-by-3 circuit 339 and an output terminal 355 to develop a 867 KHz signal, which is not used in the illustrated receiver, terminal 355 being connected through a resistor 356 to ground.

As aforementioned, the signal on line 304, applied the second input of the comparator circuit 301, is developed by counting down from the signal applied through line 116 from the voltage-controlled oscillator 112 in accordance with the input data supplied through the data and clock lines 87 and 88 from the processor circuits 86.

To receive incoming data from the processor circuits 86, a sixteen-stage shift register 360 is provided having 32 output lines, one pair of lines for each of the sixteen stages with each pair of lines being connected to the $\overline{Q}$ and Q outputs of the stage. The data input line connected to the $\overline{D}$ input of the first stage is connected to the output of an inverter 361 having an input connected to a terminal 362 which is connected to the line 87. Eight clock input lines are provided, each being connected to the input of an inverter having an output connected to the clock inputs of one pair of stages. The eight clock inputs are connected to the output of a buffer 363 having an input connected to a terminal 364 which is connected to the clock input line 88. The data is supplied through the line 87 in the form of a serial train of data pulses synchronized with clock pulses supplied through line 88, and such clock pulses may be supplied at a frequency of the order of 100 KHz, for example.

After a serial train of data pulses is clocked into the shift register 360, the thirty-two output lines thereof will be in respective states in accordance with the data supplied. Twelve output lines from the first six stages are connected to inputs of a six stage programmable counter 365 and the remaining twenty output lines from the last ten stages are connected to inputs of a ten stage programmable counter 366. Such six and ten stage programmable counters have outputs connected to terminal count detector and control circuits 367 and 368.

Inputs of the six stage and ten stage programmable counters 365 and 366 are connected together and to the output of an interface device 369 having an input connected to the output of a divider circuit 370 which has six stages and which is selectively operable as a divide-by-63 counter or as a divide-by-64 counter. The division ratio is controlled from the output of another interface device 371 having inputs connected to the terminal count detector and control circuit 367.

The input of the divider 370 is connected to the output of an amplifier 372 having one input connected to a terminal 373 which is connected to the input line from the voltage-controlled oscillator 112. A second input of the amplifier 372 is connected to a terminal 374 which is connected through an external capacitor 376 to ground.

In the operation of the count-down circuitry as thus far described, the divider circuit 370 initially divides by a factor of 63, applying output pulses through the interface device 369 both to the six stage programmable counter 365 and the ten-stage programmable counter 366. After a certain number of output pulses are developed by the divider 370, the terminal count detector and control circuit 367 may detect a terminal count condition of the six stage programmable counter 365 and then apply a control signal through the interface device 371 to the divider circuit 370 to change the division factor from 63 to 64. The time at which this change may occur is controlled by the six least significant bits of data entered into shift register 360 and applied to the programmable counter 365.

The ten stage programmable counter 366 counts the number of output pulses developed by the divider circuit 370 and when a terminal count condition is reached, it will be detected by the terminal count detector and control circuit 368 to develop an output signal which is applied through the line 304 to the frequency-phase comparator circuit 301. The number of output pulses required to produce the terminal count condition of the ten stage programmable counter 366 is controlled by the ten most significant bit information of the data entered into the shift register 360. Suitable interconnectors are provided between the circuits including lines 377 between circuits 367 and 368 and a line 378 between circuit 368 and circuits 365 and 366 for reset and control purposes.

The UHF and A-H control signals on lines 121 and 122 are developed from logic circuits connected to the last three stages of the shift register 360, which contain the data in the most significant bits of the information entered. The UHF line 121 is connected to a terminal 380 of the integrated circuit 300 which is connected to the output of an inverter and amplifier 381 having an input connected through a pair of inverters 382 and 383 to the Q output of the final stage of the shift register 360.

The line 122 is connected to a terminal 384 of the integrated circuit 300 which is connected to the output of an amplifier 385 having an input connected to the output of a NAND gate 386. One input of the NAND gate 386 is connected to the Q output of the last stage of the shift register 360. The other input of the NAND gate 386 is connected to the output of another NAND gate 387 which has inputs connected to the $\overline{Q}$ outputs of the two stages which precede the last stage of the shift register 360.

It may be noted that although not used in the illustrated system, provision is made in the integrated circuit 300 for operation in the foreign band from 66 to 88 MHz. For this purpose, a terminal 390 is provided which is connected to the output of an amplifier 391 having inputs connectd to the outputs of three inverters 392, 393, and 394 which have inputs respectively connected to the $\overline{Q}$ output of the last stage, the $\overline{Q}$ output of the second from the last stage and the Q output of the next to the last stage.

It is noted that the divider circuit 370 responds to pulses at the frequency of the voltage control oscillator 112 which may be at a frequency of close to 175 MHz in the receiver as shown and described. It is possible for the divider circuit 370 to respond to such high frequency pulses because it is not programmed directly from input data and it is controlled only to the limited extent of having its division ratio changed at one point in each complete cycle. At the same time, the proper division ratio is obtained through the use of a control from the programmable counter 365 which responds to the least significant digits of the input data. As will be clarified by numerical examples, the divider circuit, in effect, operates as a "vernier" in obtaining the proper division ratio.

The divider circuit 370 may preferably use emitter-coupled logic (ECL) circuits and the input amplifier 372 may also be an emitter-coupled logic circuit. The remaining portions of the circuitry of the integrated circuit 300 may preferably use integrated injection logic ($I^2L$), and devices 369 and 371 are provided for obtaining the proper interface. With emitter-coupled logic, the very high speed of operation required for direct response to signals at the oscillator frequency can be obtained.

Figure 7:
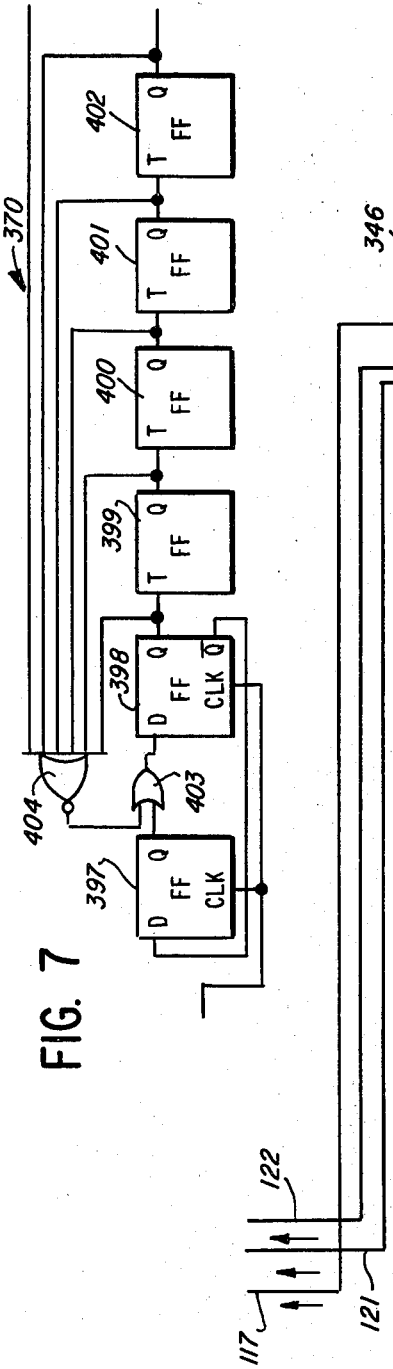
FIG. 7 is a schematic diagram of a divider circuit used in the frequency synthesizer circuits shown in FIG. 6.

FIG. 7 shows the circuitry of the divider circuit 370 which includes six flip-flops 397–402. The input signal is applied to the clock inputs of the first two flip-flops 397 and 398 with the D input of flip-flop 397 being connected to the $\overline{Q}$ output of the second flip-flop 398. A gate 403 has an output connected to the D input of the second flip-flop 398, one input connected to the Q output of the first flip-flop 397 and a second input connected to the output of an OR gate 404. Q outputs of the flip-flops 398–402 are connected to inputs of the gate 404 along with a line connected to the output of the interface device 371. Q outputs of each of the flip-flops 398–401 are additionally connected to the timing inputs of the subsequent flip-flops, the Q output of the final flip-flop being an output line connected to the input of the interface device 369. With the circuitry as shown, a high speed of operation can be obtained while also permitting control of the division factor from 63 to 64 in the manner as above-described.

To obtain the required division factors, the serial data pulses applied through line 87 effect entry of the binary equivalent of a certain number M into the shift register 360. The number M is determined in accordance with the signal frequency f, the intermediate frequency IF and the band of operation.

In the low band from 30 to 50 MHz, the oscillator frequency is equal to the sum of the intermediate and signal frequencies, varying from 40.8 MHz to 60.8 MHz. Also, in the low band as well as in the aircraft and high bands, the output of the divider of line 304 is compared with a 5 KHz reference on line 303 in order to obtain frequency reference changes having an integer relationship to the channel spacing requirements imposed by the FCC. Thus, the required division ratio is from 8,160 to 12,160.

The six stage divider circuit 370 and the ten stage counter 366 provides a total count capacity of $2^{16}$ or 65,536. To provide a division ratio of from 8,160 to 12,160 for operation in the low band, the number to be entered into the shift register 360 is from 65,536 minus 8,160 or 57,376 to 65,536 minus 12,160 or 53,376.

As an example of the operation of the circuitry, the binary equivalent of 57,376, the number M for operation at 30 MHz, is 1110000000100000. After entering this number in the shift register 360, the six least significant digits (100000) are entered into the six stage program counter 365 and the counter will count a number of pulses equal to the number entered, in this case 100000 or 32, after which the terminal count detector and control circuit 367 will cause the application of a signal to the divider circuit 370 to change the division factor from 63 to 64.

Thus, a total of 63×32 pulses or 2,106 pulses will be counted after which the division factor will be changed to 64. The ten most significant digits are entered into the programmable counter 366 which counts a number of pulses equal to its capacity of 1,024 less the number entered which is 896 in this example. The number of input pulses required to cause the programmable counter 366 to complete its count is the product of 64 and the difference between 128 and 32 or 6144. Thus, the total number of input pulses is the sum of 2016 and 6144 or 8160 which is the factor required to produce an output frequency of 5 KHz when the input frequency is equal to 40.8 MHz.

The operation in the A band is the same as it is in the low or L band. The operation in the H or high band is similar except that the oscillator frequency is below the signal frequency rather than above the signal frequency as in the L and A bands. With regard to operation in the UHF band, to obtain a frequency difference having an integer relationship to those imposed by the FCC, and to take into account the use of the frequency tripler, a reference frequency of 4.1667 KHz is used, equal to ⅓ of 12.5 KHz.

The requirements as to the number M are summarized as follows:

Low Band

30 MHz to 50 MHz
M=65,536−200(f+IF)
for 10.8 MHz IF, M is from 57,376 to 53,376, (binary, from 1110000000100000 to 1000110101010000)

Aircraft Band

118 MHz to 136 MHz
M=65,536−200(f+IF)
for 10.8 MHz IF, M is from 39,776 to 36,716 (binary, from 1001101101100000 to 1000110101010000)

High Band

144 MHz to 174 MHz
M=65,536−200(f−IF)
for 10.8 MHz IF, M is from 38,896 to 32,896 (binary, from 1001011111110000 to 1000000010000000)

UHF Band 4205 to 512 MHz
M=65,536−80(f−IF)
for 10.8 MHz IF, M is from 32,760 to 25,440 (binary, from 0111111111111000 to 0110001101100000)

Foreign Band 66 to 88 MHz
M=65,536−200(f−IF)

It is noted that in the low band, the three most significant digits are 111 at the low end and 110 at the high end, that in both the aircraft and high bands the three most significant digits are 100 and, in the UHF band, the three most significant digits are 011. In the logic circuitry for developing the UHF and A-H signals on lines 121 and 122, the UHF signal on line 21 is developed from the absence of a 1 in the most significant digit. The OSC signal on line 122 is developed by the concurrent development of a 1 in the most significant digit and a 1 as either the next digit or as the second from the most significant digit.

FIG. 8 is a schematic diagram of the keyboard, display and processor circuits 86. The circuits include a single-chip microcomputer 410 which is manufactured by the Microelectronics Group of Rockwell International Corporation and has a designation of MM78L.

The microcomputer 410 includes an accumulator 411 an arithmetic logic unit 412 and a carry flip-flop 413 for arithmetic operations and for loading and exchange of data. Upon command, data will be loaded into the contents of the accumulator 411 from channel 1 and channel 2 input ports which are connected to receivers 414 and 415.

The microcomputer 410 further includes ten discrete input/output ports which are provided by multiplexer drivers and receivers 416, a program counter 417, a read only memory 418, an instruction decode circuit 419, a random access memory 420 and a data address and register unit 421. The ROM 418 has a capacity of 204×8 and the RAM 420 has a capacity of 128×4.

An interrupt section 422 is provided for detecting external signals and setting internal control flip-flops. Drivers and receivers 423 are provided for channel A ports with an A buffer being provided for output of display functions through the A ports. Similarly, B drivers and receivers 425 and a B buffer 426 are provided, an auxiliary register 428 being associated therewith.

An S register 430 is provided which is a 4-bit serial-in/serial-out parallel exchange register, a shift counter 431 being connected thereto.

The microcomputer 410 operates in conjunction with a random access memory 434 which may be a CMOS memory having a 256×4 capacity and may be a type 74801 manufactured by National Semiconductor Corporation. The memory 434 is used to store program data entered in by the user of the receiver and is connected to a battery in a manner such that information entered in will be retained even when the receiver is disconnected from an AC voltage supply line.

The microcomputer 410 controls the transfer of information to and from the memory 434 and from the keyboard 26 and also performs its various functions in response to signals from the keyboard 26.

As shown in FIG. 8, the keyboard 26 includes switches which are operated by numeric keys 30-39 and which are respectively connected to terminals 436-445, all being connected to another terminal 446. Other switches are connected to an additional two terminals 447 and 448. Terminals 446-448 are connected to "Channel 1" input ports provided by receiver 414.

For strobing of the keyboard 26 for transmission of information to the microcomputer 410 and memory 434, the terminals 436-443 are connected to outputs of a dual 4-bit shift register 449 while terminals 444 and 445 are connected to outputs of a dual D flip-flop 450, the shift register 449 and the flip-flop unit 450 being operated in cascade and together forming a 10-bit shift register operative to strobe the keys of the keyboard 26.

The outputs of the shift register 449 and dual D flip-flop 450 are connected to digit drivers 451 and 452 for the display 29 which has terminals connected to outputs of two four-segment driver circuits 453 and 454. Terminals of the circuits 453 and 454 are connected through resistor units 455 and 456 to a power supply terminal 457.

Control or input terminals of the segment drivers 453 and 454 are connected to "A" and "B" ports of the microcomputer 410, such ports being also connected to data inputs of the memory 434.

Three of the ten discrete input/output ports provided by the multiplexer drivers and receivers 416 are connected through lines 458, 459 and 460 to "C/S Sub 1" "A Sub 5" and "A Sub 6" terminals of the memory 434, lines 459 and 460 being also connected to the shift register 449.

In the operation of the circuitry as thus far described, the keyboard 26 is strobed by means of the 10-bit shift register provided by the circuits 449 and 450 and/or which are stored temporarily within the microcomputer 410 for control of the operation of the receiver. The strobe signals are also applied to the digit driver circuits 451 and 452 which have outputs connected to the display 29. For operation of the display 29, data is multiplexed from the "A" and "B" output ports of the microcomputer 410 and through the segment drivers 453 and 454 to the display.

In the operation of the microcomputer 410, an interrupt signal is applied through a line 462 either periodically or at a certain time after the microcomputer 410 develops a signal on a line 463 connected to one of the input/output ports provided by the circuits 416. For this purpose, multivibrator circuit 464 is provided including three gates 465, 466, and 467 of an integrated circuit 468. The output of the gate 465 is connected to the line 462 while the two inputs thereof are connected together into the output of the gate 467, the inputs of gate 465 being also connected through a resistor 469 to a circuit point 470 which is connected through the parallel combination of a resistor 471 and a diode 472 to one input of gate 467 which is also connected through a capacitor 437 to the output line 462. The other input of gate 467 is connected to the output of the gate 466 the inputs of which are connected together into the line 463 which is connected to one of the ports provided by circuits 416.

The multivibrator circuit 464 operates as a free-running multivibrator to periodically apply an interrupt signal. It may be reset at any time in response to the application of a signal on line 463 to apply an interrupt signal after a certain delay time. The frequency and the delay time are determined by the values of the resistors 469, and 471 and the capacitor 473.

Circuitry is provided for the application of supply voltages in a manner such that the contents of the random access memory 434 will be retained when the receiver is disconnected from a supply line and in a manner such that the circuits will be properly initialized when the receiver is connected to a supply line and when the on-off switch is turned on.

One terminal of the RAM 434 is connected to a circuit point 475 which is connected through a resistor 476 to ground and through a Zener diode 477 to a circuit point 478 which is connected to a second terminal of the RAM 434 and which is connected through a diode 479 to a terminal 480, a battery 481 being connected between terminal 480 and ground.

The circuit point 478 is also connected through a diode 482 to a circuit 483 which is connected to the emitter of a transistor 484 having a collector connected to a +16 volt supply terminal 485. The base of transistor 484 is connected through a resistor 486 to a +9 volt supply terminal 487 and is also connected through a capacitor 488 to ground. The circuit point 483 is additionally connected through a diode 489 to a circuit point which is connected to the terminal 457 for supplying power to the segment drivers 453 and 454 through the resistance units 455 and 456. Also, a resistor 490 is connected between terminal 457 and a terminal 492 connected through a capacitor 493 to ground. The terminal 492 is the voltage supply terminal for the microcomputer 410 and for other circuits including the shift register 449, flip-flop 450 and digit drivers 451 and 452.

In the operation of the power supply circuitry as thus far described, the battery 481 supplies an operating voltage to the RAM 434 when the receiver is disconnect from the line or when the on-off switch is off, the voltage being regulated by the Zener diode 477. When line voltage is applied, the power supply circuits 94 are rendered operative to supply voltages to terminals 485 and 497 and the RAM 434 is then supplied with operating voltage through diode 482 and transistor 484 from the terminal 485. Operating voltage for the segment drivers 453 and 454 and for the microcomputer 410 and other circuits is supplied through the diode 489.

An active power-on reset circuit is provided including a transistor 496 having an emitter connected to the terminal 492 and having a collector connected through a resistor 497 to ground and also connected to an input of the program counter 417 of the microcomputer 410. The base of the transistor 496 is connected through a resistor 498 to a circuit point 499 which is connected through a capacitor 500 to ground and which is connected through the parallel combination of a diode 501 and a resistor 502 to the terminal 492.

In normal operation, transistor 496 is nonconductive. When the receiver has been turned off, the capacitor 500 will not be charged and when the receiver is turned on, the transistor 496 will be rendered conductive thrugh the voltage supplied through resistor 502 and resistor 490 to the base thereof. The capacitor 500 will charge through the resistor 502 and when it is fully charged, the transistor 496 will be cut off. Thus, a step function is applied to the input of the program counter and the microcomputer 410 will be initialized to the first instruction.

Circuitry is also provided for insuring that data will not be improperly read into or removed from storage in the RAM 434 during a start-up. A read-write input of the RAM 434 is connected to the collector of a transistor 503 and also through a resistor 504 to the supply terminal 492, the emitter of the transistor 503 being connected to ground. The "STR" input of the RAM 434 is connected through a resistor 505 to ground, through a diode 506 to a point provided by the circuit 416 and through a diode 507 to the collector of a transistor 508, the emitter of the transistor 508 being connected to the battery terminal 480 and the base of the transistor 508 being connected through a resistor 509 to the supply terminal 492.

The operation of the processor circuitry is disclosed in detail in the flow charts depicted in the drawings. In examining the flow charts, the basic functions of the various keys and the operation of the display as described hereinbefore, should be kept in mind. The following detailed examples of the use of keys may also be helpful.

The user can program the receiver 20 to scan twenty different frequencies, one in each of the twenty channels. As an example, to program 162.55 MHz in a desired channel, for instance channel 14, the manual key 43 is pressed, repeatedly if necessary, to step until the desired channel 14 is reached which will be indicated by the appearance of numbers 1 and 4 in the second and third display windows of 58 and 59 (FIG. 3). Then numeric keys 31, 36, 32, 40 and 35 are pressed, whereupon "162.550" will appear in the last six windows of 62–67 of the display 29. Then the E or "ENTER" key 42 is depressed which will enter the frequency of 162.55 MHz in channel 14. Then the manual key may be depressed to step to a next channel 15, or to any other channel in which it may be desired to enter another frequency. The procedure may then be repeated.

If a user attempts to program a frequency that is outside the tuning range of the receiver, "ERROR" will appear on the display 29. If this happens, he may simply enter a new frequency. If the user makes a mistake programming the frequency on a channel, he may press the decimal point key 40 twice and then program the correct frequency.

To display any channel manually when scanning is stopped, the user may then press the one or two keys which identify the channel and then press the manual key 43.

To program a lock-out of any programmed frequency and to cause the receiver to skip over the frequency when scanning, the channel containing that frequency is first selected manually and the lock-out key 48 is pressed. The letter "L" will then appear in the fifth window 61 of the display 29.

Normally, the receiver will scan at a fast rate such as eleven channels per second, for example. To scan slowly, the speed key 45 may be pressed. To resume the fast scan, it may be pressed again.

As mentioned hereinbefore, the scanner may be programmed to pause for about one second after a transmission on any selected channel which is useful when both sides of a conversation are transmitted on the same frequency. The manual key 43 is pressed, repeatedly if necessary, to step to a selected channel and then the delay key 47 is pressed, whereupon the symbol "d" will appear in the fourth window 60 of the display as shown in FIG. 3. To remove the delay function, the delay key 47 may be pressed again, and the symbol "d" will then disappear.

To search for unknown signals between two frequencies in the same band, the manual key is stepped to any one of the twenty channels which it may be desired to use for the purpose. Then numeric keys are depressed in the same manner as when programming the frequency, to enter one limit of the range to be searched. Then the limit/hold key 54 is pressed and then numeric keys for the other limit are pressed after which the limit/hold key 54 is pressed again to enter the other limit. Then when the search key 53 is pressed, the receiver will automatically search through the frequency range. When an active channel is found, the search will stop and the frequency will be displayed. Once the search has been started, the delay may be pressed which will program the delay function until the same delay key is pressed again or the search operation is terminated. If the user desires to store the active frequency in the channel in use for the search operation, he may simply press the "E" key 42. If the user desires to stay on the frequency, he may press the limit/hold key 54 which will then perform its hold function. The hold function may also be performed while searching without signal present.

If "Error" appears in place of a frequency, it indicates that the search limits set are not in the same band or that an out of band frequency was attempted.

To search the aircraft band, the Aircraft key 52 is depressed, and the letter "a" will appear in the fifth window 61.

To search the maritime band, the "Marine" key 51 is pressed and the symbol "—" will appear in the fifth window 61 of the display.

FIGS. 9A, 9B, 9C, 9D and 9E depict a main routine flow chart showing the general operation of the system. It is noted that an important feature of the system is in the provision of a "Find Future" routine which is illustrated in detail in FIG. 10A and 10B and which increases the scanning rate of the system. With the routine, the system outputs a frequency code to the synthesizer and synchronizes an external timer which determines the amount of time allowed for the synthesizer to lock on a frequency before the signal present line is tested. While waiting for the synthesizer to lock, the system finds the next code it will output. The time left after finding the next code is devoted to refreshing the display. When the synthesizer lock time has elapsed, the external timer generates an interrupt signal which is transmitted to the processor. If the system is in a scanning mode and no signal is received, then the system is in a condition to immediately output a new code to the synthesizer. Thus, the scanning rate is increased. At the same time, the system is so constructed as to allow use of a manual mode and the priority features in a normal manner.

Figure 9A:
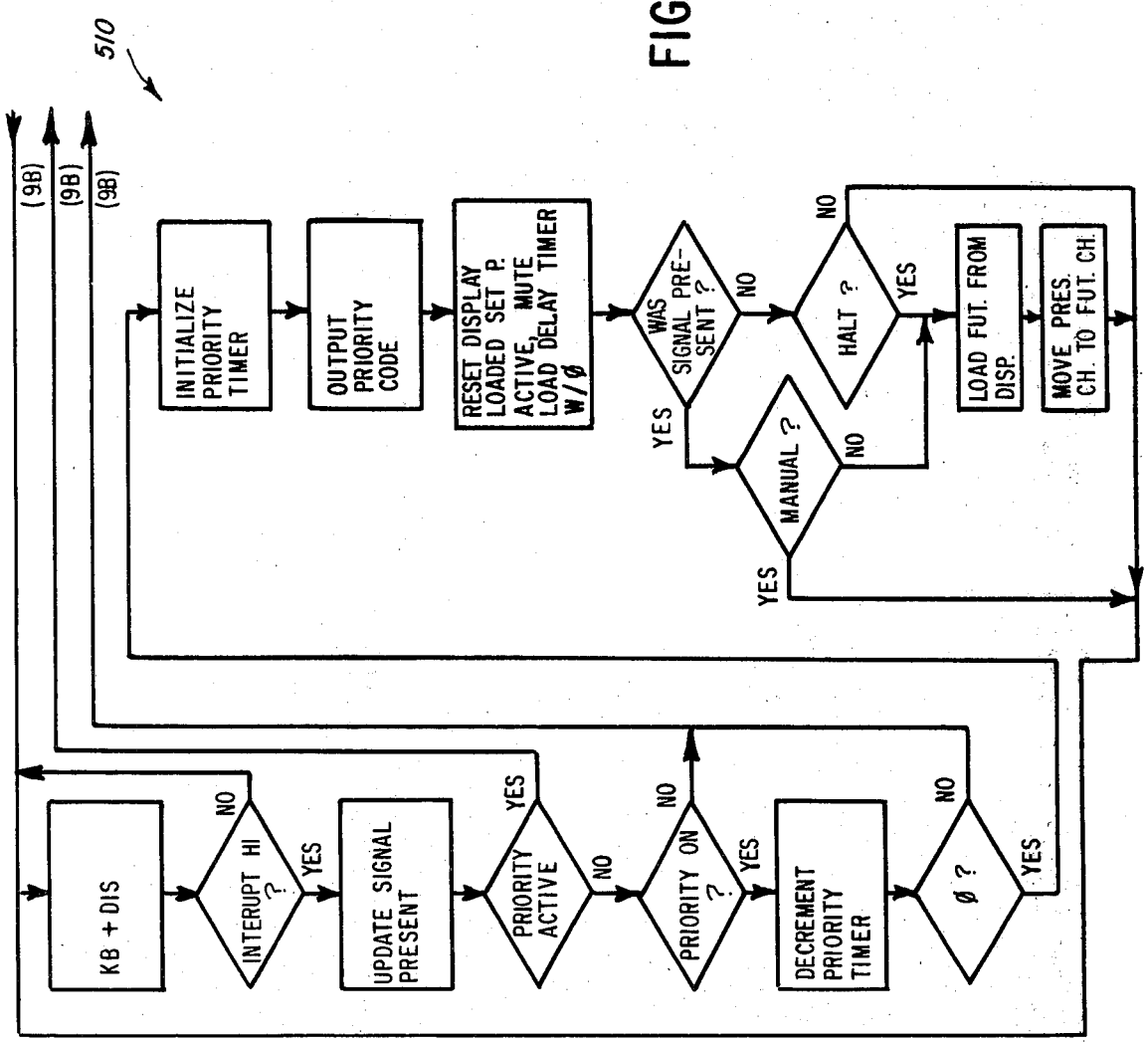
FIGS. 9A through 9E together provide a flow chart for a main routine which is provided in the operation of the processor circuits of FIG. 8.

FIG. 9A reference numeral 510 designates a portion of the main routine in which the display is refreshed until an interrupt is detected. If an interrupt is detected, there is an update of a record of a signal present status, recording the signal as of a time of the interrupt. Then a priority active test is made and if the system is in the middle of a priority sample, or if not and if no priority has been selected for the present channel, the system goes on to routines for manual or scan or search modes as shown in FIGS. 9B-9E. Also, if after a decrement or update of the priority timer, it is found that the time for the priority routine has not occurred, then the entire system may go on to the routines of 9B and 9C and/or FIGS. 9D and E.

However, if priority has been selected for the current channel and if it is time for the priority routine, it is followed as shown in the lower portion of FIG. 9A. After initializing a priority timer, the system outputs a stored priority code to the synthesizer to tune the receiver to the priority frequency. Then after resetting display loaded, setting priority active, removing the audio mute and loading a delay timer, a test is made as to whether there was a signal present as of the time of the interrupt. If so, and if the system is in the manual mode, the system returns to the initial starting point. If there was no signal present and if a halt mode is not a factor, the system also returns to the initial point at the top of the chart in FIG. 9A.

However, if a signal was present and manual mode is not selected or if with no signal present, the halt mode is selected, the system loads a future register from the display and then moves the present channel data to the future channel register, then returning to the initial point. Thus, a frequency displayed at the time of the priority sample is saved in a future register. This portion of the routine is important in allowing use of the find future routine while also allowing the user to give a particular channel a priority status.

Figure 9C:
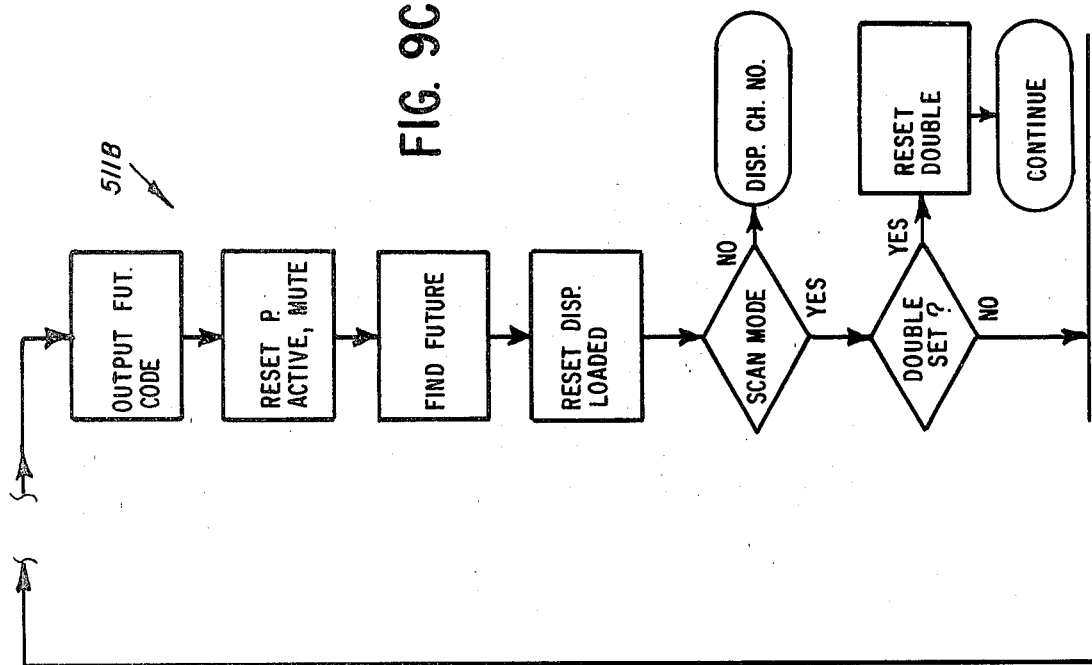
Figure 9B:
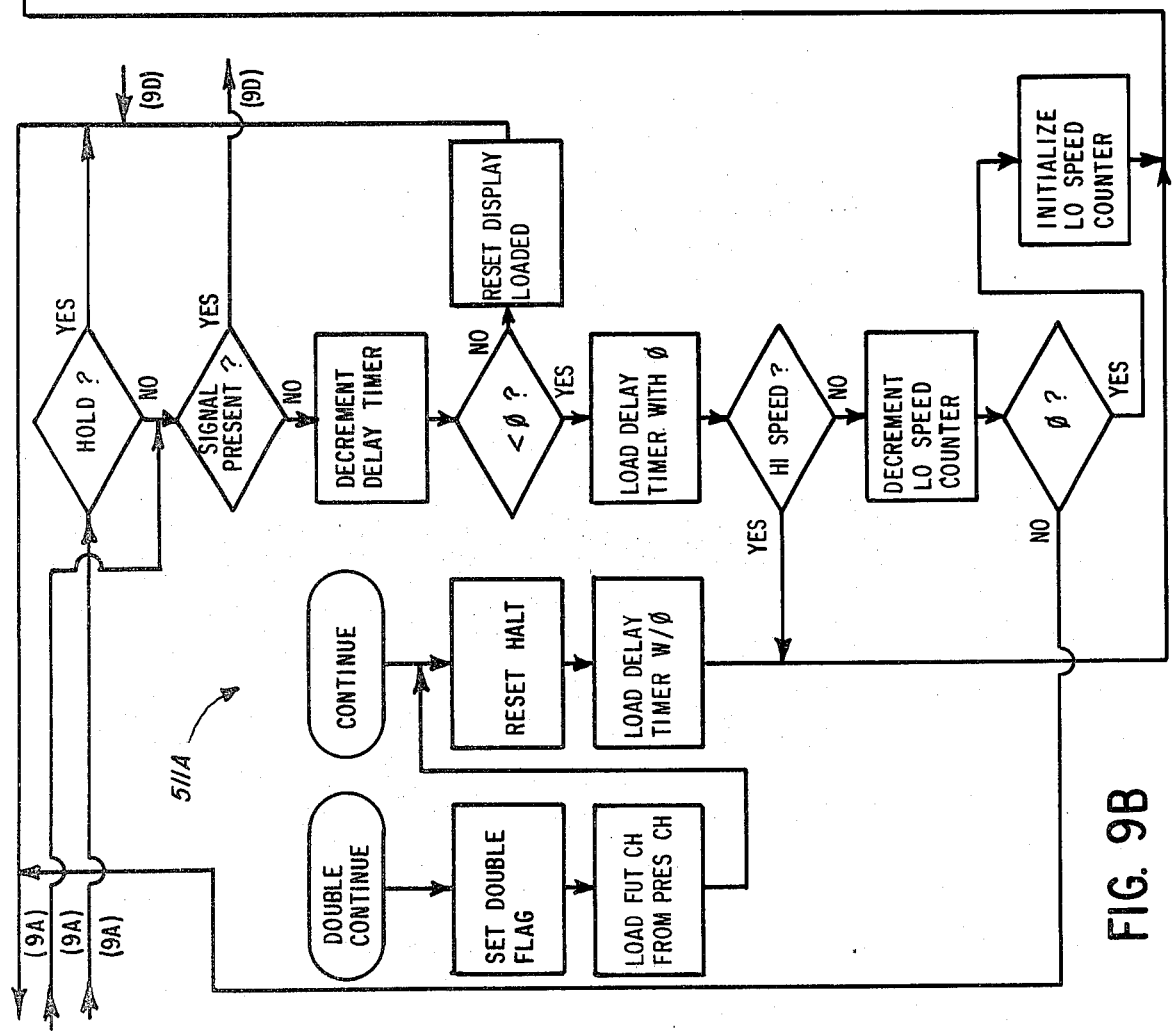

In FIGS. 9B and 9C reference numerals 511A and 511B generally designate portions of the main routine which are followed when the system outputs a future code. When there is no signal present, the high speed flag is tested. If low speed is selected, the system outputs the future code every third interrupt as compared to the high speed operation which the system outputs the future code every interrupt.

The system may also output the future code in response to a "CONTINUE" signal developed under certain conditions following closure of "SCAN, LOCK-OUT, SEARCH, PRIORITY" key switches. Such conditions are defined by flow charts on key action routines as described hereinafter effective to reset a halt circuit, load a delay timer and then output the future code. It is noted that the routine forces an immediate resumption, without delay or slow speed, when locked onto a channel because of a halt, signal present, etc.

A "DOUBLE CONTINUE" signal may be effective in a similar manner after setting a double flag and loading the future channel from the present channel. The "DOUBLE CONTINUE" signal is derived from a routine following operation of the scan key and the routine is used to initiate a scan. The continue routine is executed twice, first to find the next future code and then again to output that code and find the next. During the first time through, output of the future code serves no purpose other than to re-sync the interrupt clock which is critical because the scan portion of find future assumes that such has been done. The future channel must be set equal to the present channel at the beginning of double continue to avoid a possible lock-up in the first part of find future, scan.

After the system outputs the future code, it resets priority active, clears the mute signal, finds a future code and then resets display clear. It is noted that display clear cannot be reset at an earlier time because it is tested in find future, as hereinafter clarified.

Figure 9E:
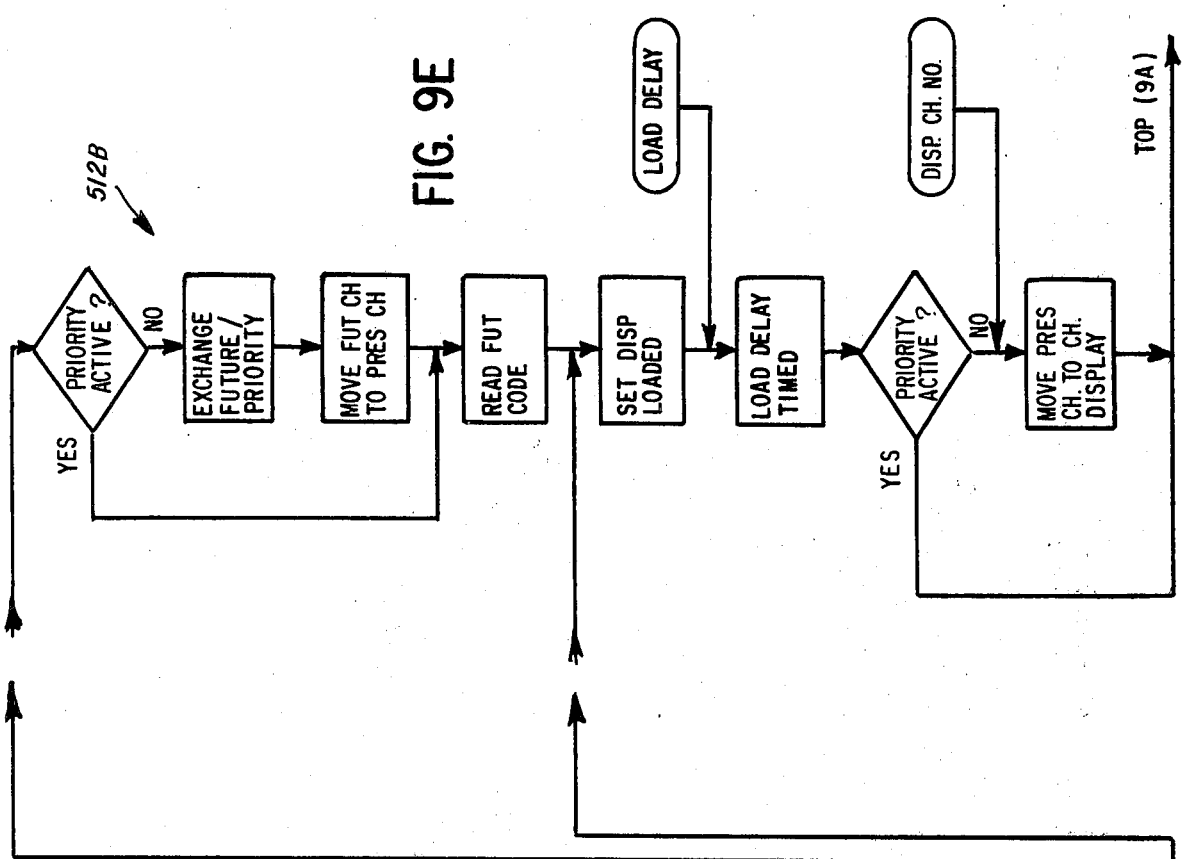
Figure 9D:
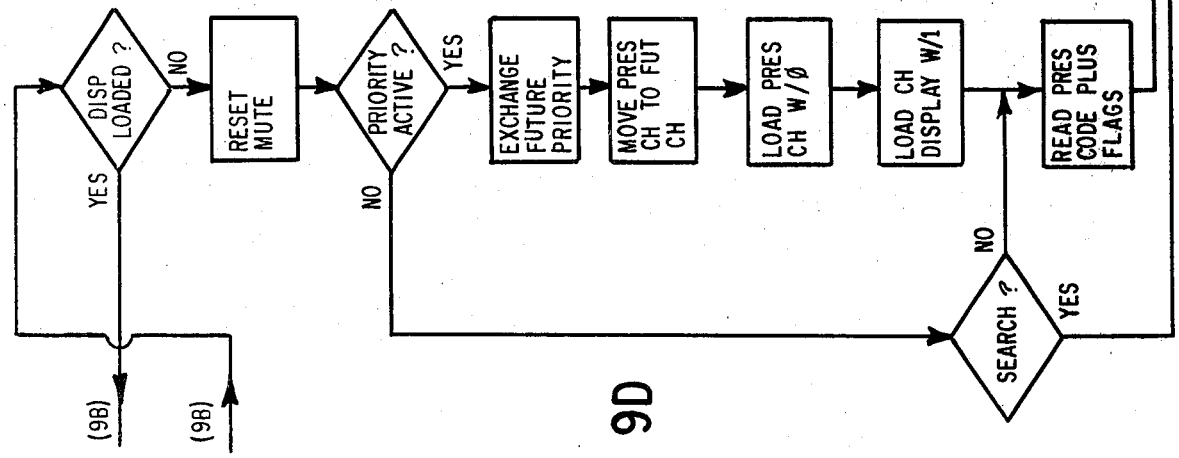

In FIGS. 9D and 9E, reference numerals 512A and 512B generally designate portion of the main routine which may be described as a signal present routine. In the presence of a signal and when the display is not loaded, the mute is removed, if set, and if the priority is active, the priority data is moved to future, saving the future data, the present channel is saved in the future channel and the channel is loaded with the priority data. Then a present code is read, wiping out the future code and bringing in the lock-out and delay flags. If the priority is active, the system restores present channel, exchanging future with priority. Present channel is left in future so that after a priority signal is present, the next channel to be scanned will be the former present channel.

Next the display is loaded from the present code and the future code is restored to future, display loaded being then set and a delay timer being then loaded. If at this point, priority is not active, the system moves the present channel to the display channel. However, if the priority is active and thus the display channel is already loaded, it is left undisturbed.

It is noted that the last operation may be performed in response to a "DISPLAY CHANNEL NUMBER" signal which may be applied following operation of the manual, marine and aircraft keys. This routine which provides a jump to the top, first loads the channel number portion of the display.

It is also noted that the delay timer may be loaded in response to a "LOAD DELAY" signal which may be developed from the find future routine under certain conditions. This routine provides a jump to the top after first loading a delay timer and also the channel display.

Figure 10B:
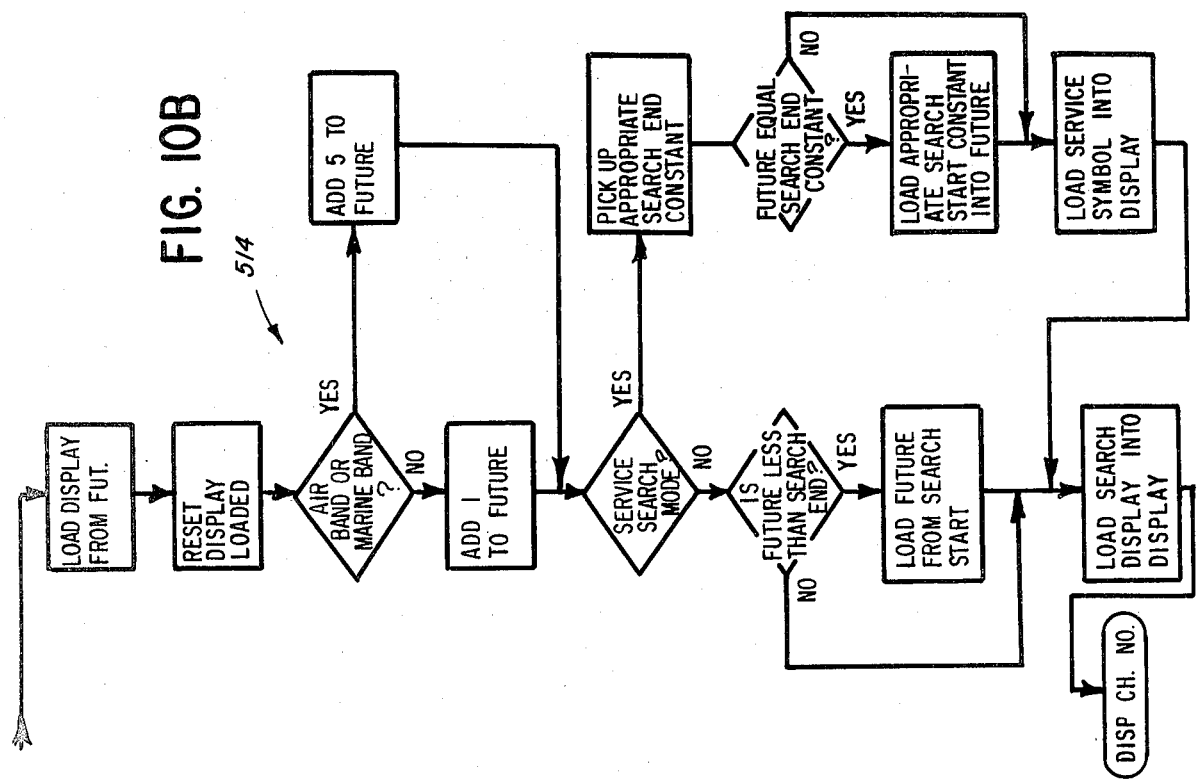
FIGS. 10A and 10B together provide a flow chart for a find future routine used in a processor circuitry of FIG. 8.
Figure 10A:
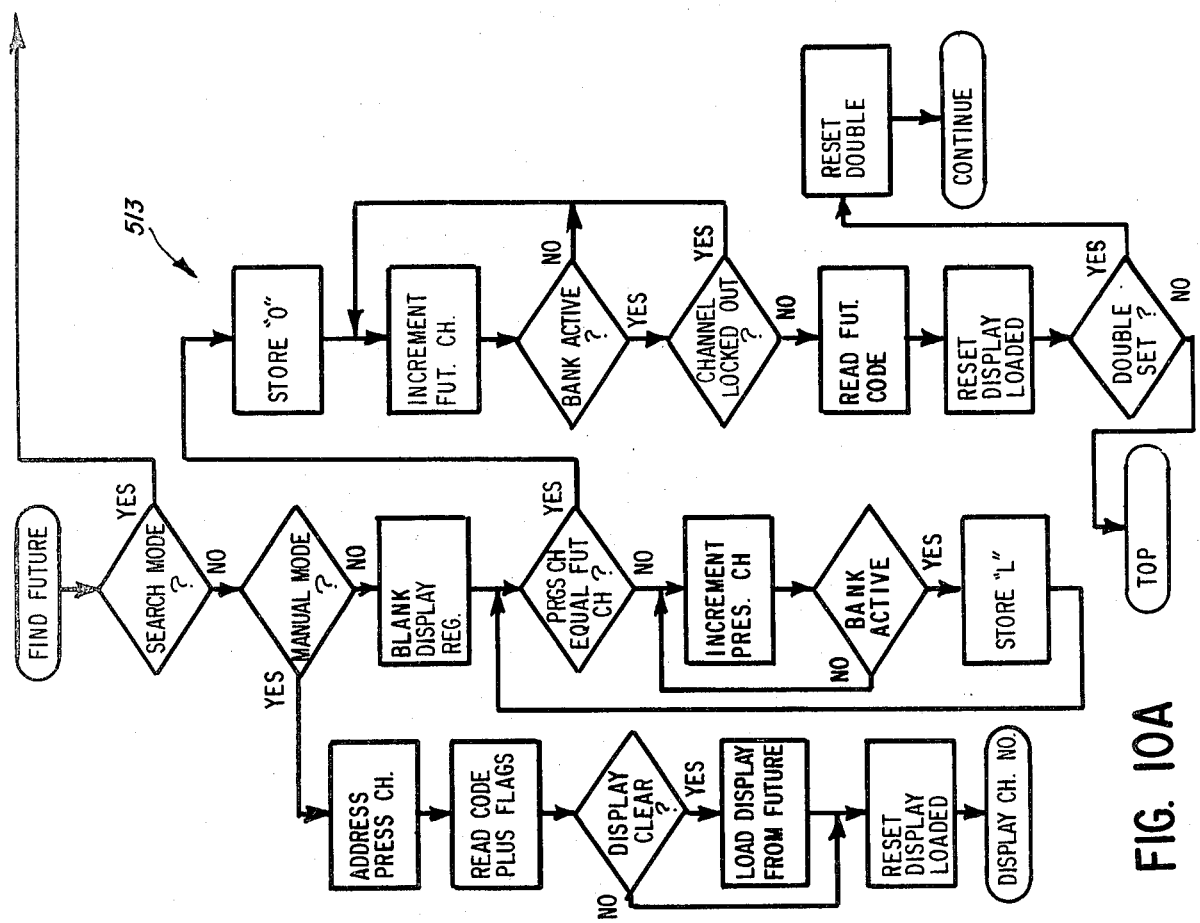
Figure 13:
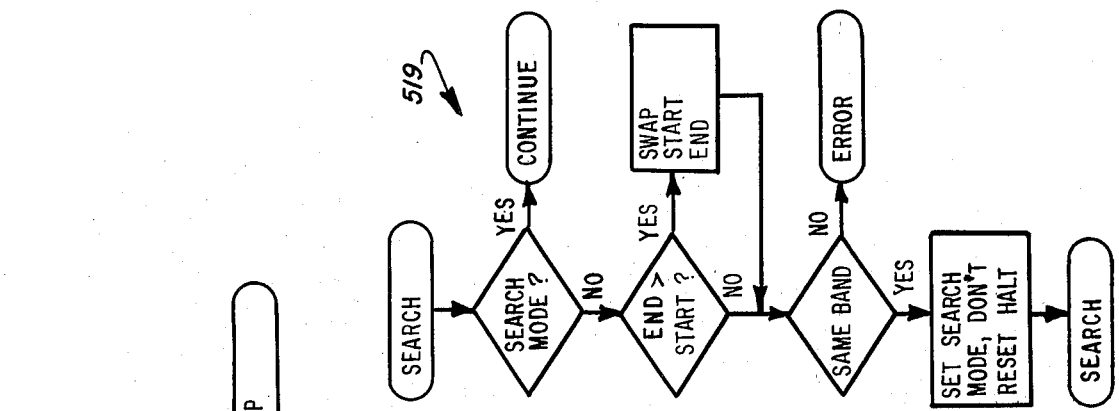
Figure 12:
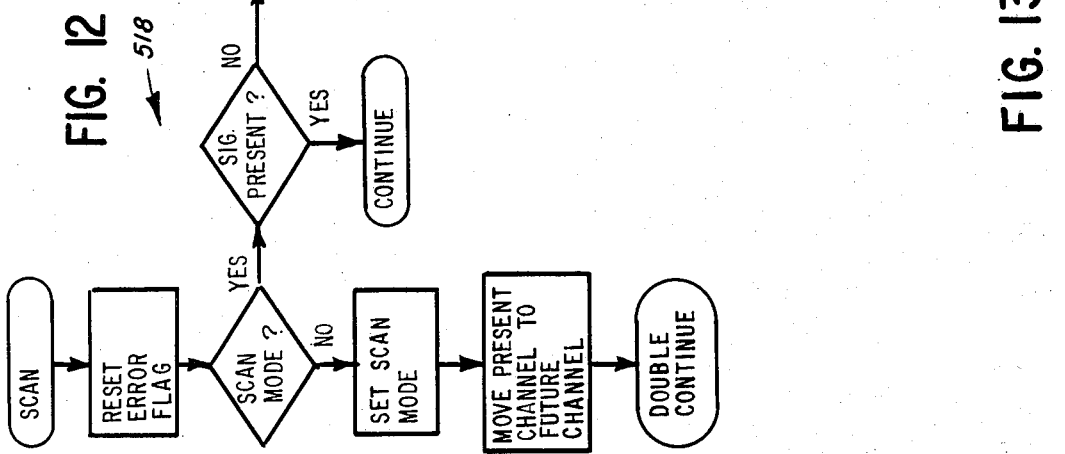
Figure 11:
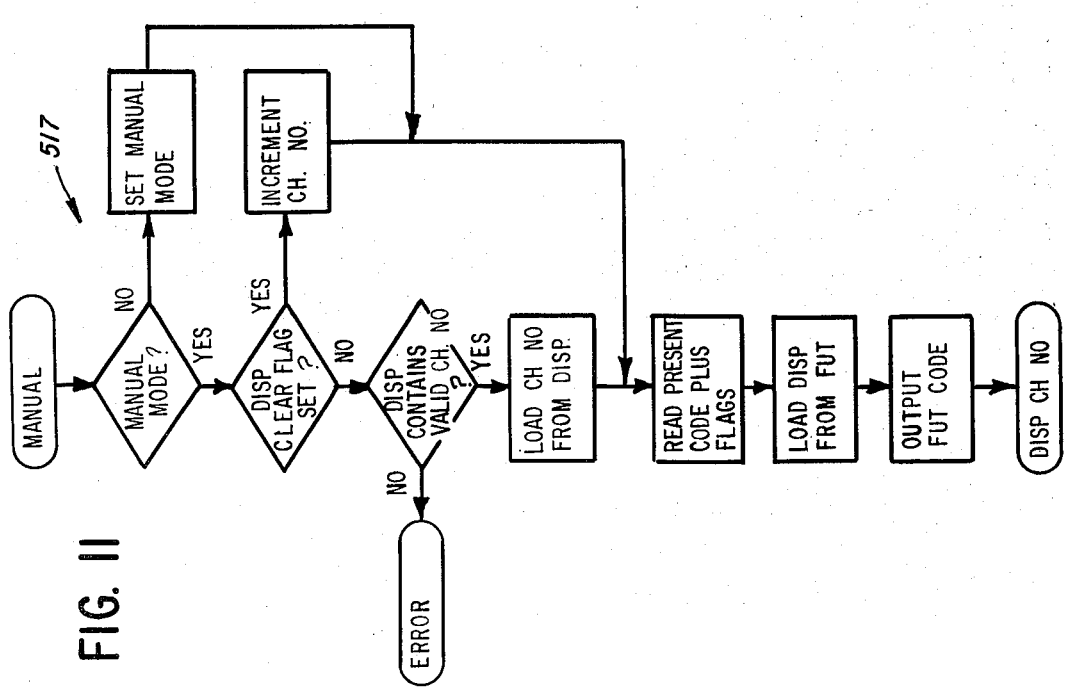
Figure 16:
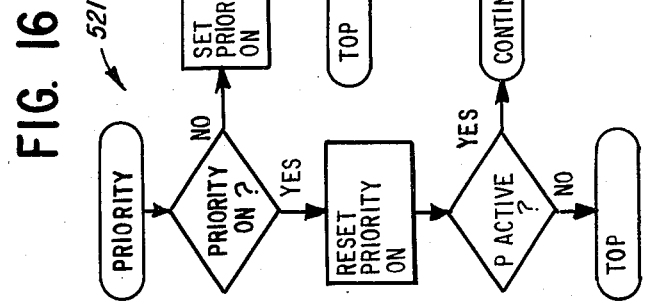
Figure 15:
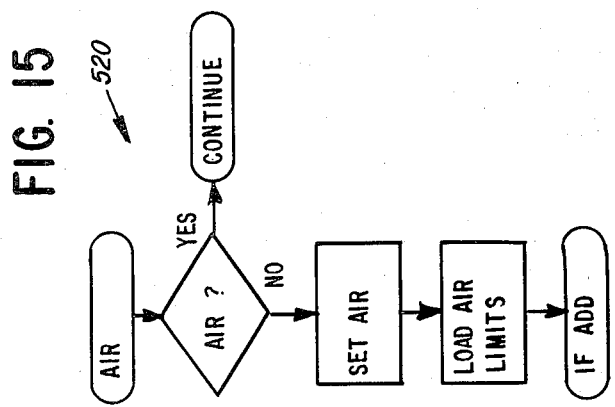
Figure 14:
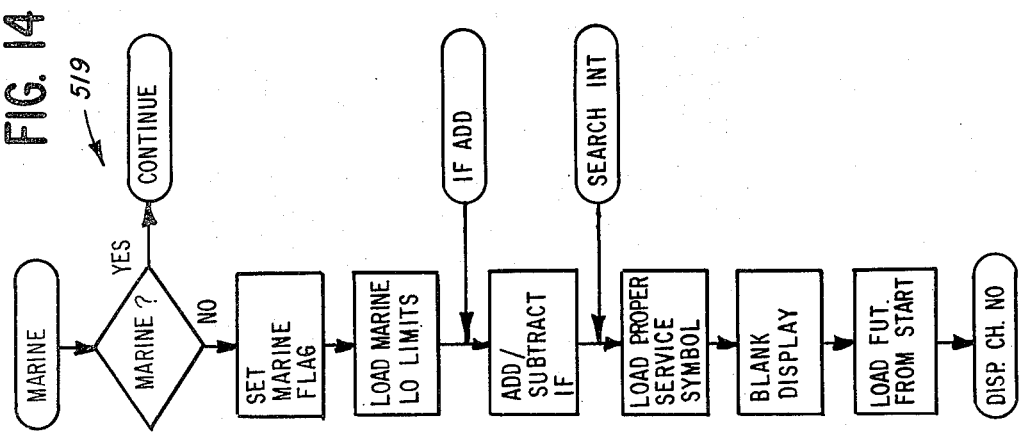

Referring to FIG. 10A, reference numeral 513 generally designates portions of a find future routine, followed in manual and scan modes, find future routines in search and service modes being illustrated in FIG. 10B. It is noted that in the manual mode, the find future routine will only be executed after a priority sample. Delay and lock-out flags from memory are loaded into the display in case they were erased by a signal present on priority. If the display was clear (i.e., the user had not entered a number), it is loaded with the proper frequency, otherwise it is left alone so that any number the user may have entered is not erased.

In connection with the incrementing of the present channel, it is noted that this operation is performed until it equals the next unlocked future channel, and "L" is stored in the proper digit for each intervening channel. If the present channel is equal to the future channel, a zero is stored in place of the last "L" and then the future channel is incremented until an unlocked channel is found.

The bank active test is performed to determine if an interrupt has occurred. Normally, the loop will finish long before an interrupt is due, provided that the interrupt clock has just been re-synced by the output future code routine. If an interrupt is detected, it is assumed that the loop is endless and that the processor is hung up. When this happens, the system moves the program into the manual mode.

In FIG. 10B, reference numeral 514 generally designates portions of the find future routine used in the search and service modes. Initially, the display is loaded from the future register so that the display contains the frequency that has just been output to the synthesizer. Then display loaded is reset and a test is made as to whether one or the other of the air or marine bands has been selected. If so, five "1" digits are subtracted from the future channel code to cause incrementing by 25 KHz, it being noted that every "1" subtracted from synchronizing code represents an increase in 5 KHz when operating in the A band and in the H band which includes the marine band, as well as in the low band. If neither the aircraft band nor the marine band has been selected, "1" digit is subtracted from the future code, incrementing by 5 KHz being proper for most bands.

Then another test is made as to whether a service search mode has been selected. If so, an appropriate search end constant is read from a table and the test is made as to whether the future code is less than the search end constant. If it does, the appropriate search start constant is loaded from the table into future. The service symbol is loaded into display and then a search delay is loaded into the display channel, the channel number then being displayed.

If the service search mode is not selected, a test is made to determine whether the future code is less than the search end limit. If not, the search delay is loaded into the display and the channel number is displayed. If future is less than the search end limit, future is first loaded from search start.

In this routine, the service symbol and/or the delay symbol are reloaded in case they were erased from the display by a signal present of priority.

The find future routines take place concurrently with the operation of the synthesizer in tuning to a new frequency, conditioning the system so that it is ready to output a new code if no signal is received.

The control of the incrementing finder is important in effecting a rapid scan through the service bands which contain a large number of channels.

FIGS. 11 through 22 illustrate key action routines. In these figures, reference numerals 517 through 528 respectively designate routines which follow operation of the manual key 43, the scan key 44, the search key 53, the marine key 51, the aircraft key 52, a priority key 46, the numeric keys 30–39, the enter key 42, the limit/hold key 54, "10" or "20" keys 49, 50, a lock-out key 48 and the delay key 47.

A "CONTINUE", "DOUBLE CONTINUE", "DISPLAY CHANNEL NUMBER" and other signals produced from the routines shown in the charts of FIGS. 11–22 are applied as indicated in the main routine flow chart of FIGS. 9A, 9C, 9D and 9E and the find future flow charts of FIGS. 10A and 10B.

Figure 23:
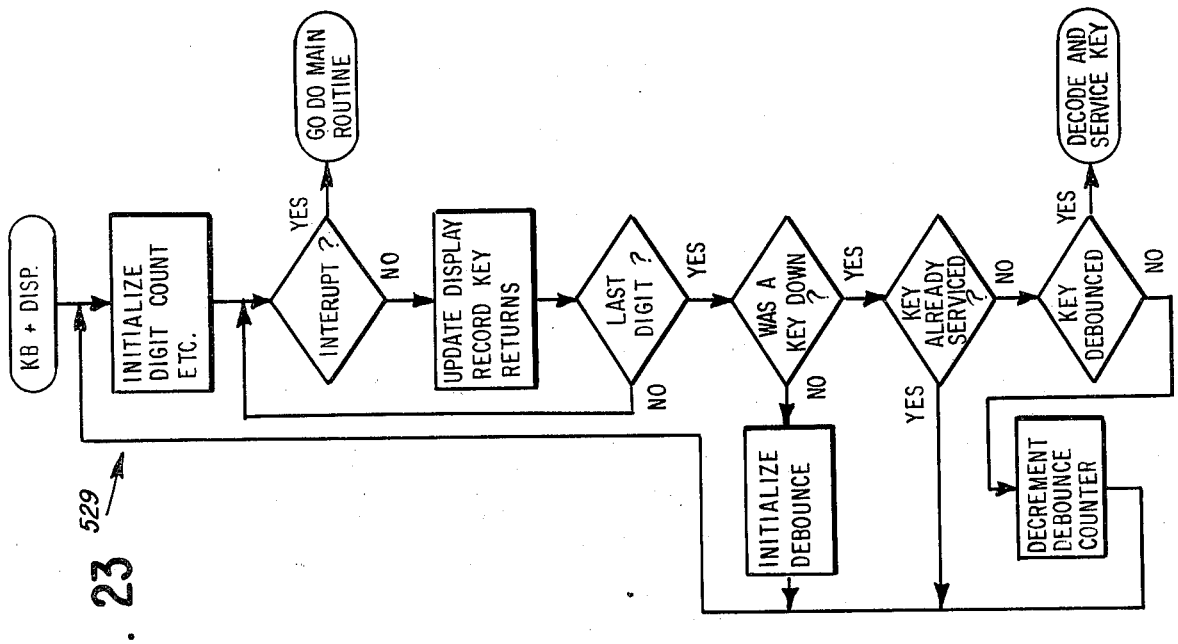
FIG. 23 provides a flowchart showing portions of the routine followed in the processor in connection with keyboard and display portions of the receiver.
Figure 22:
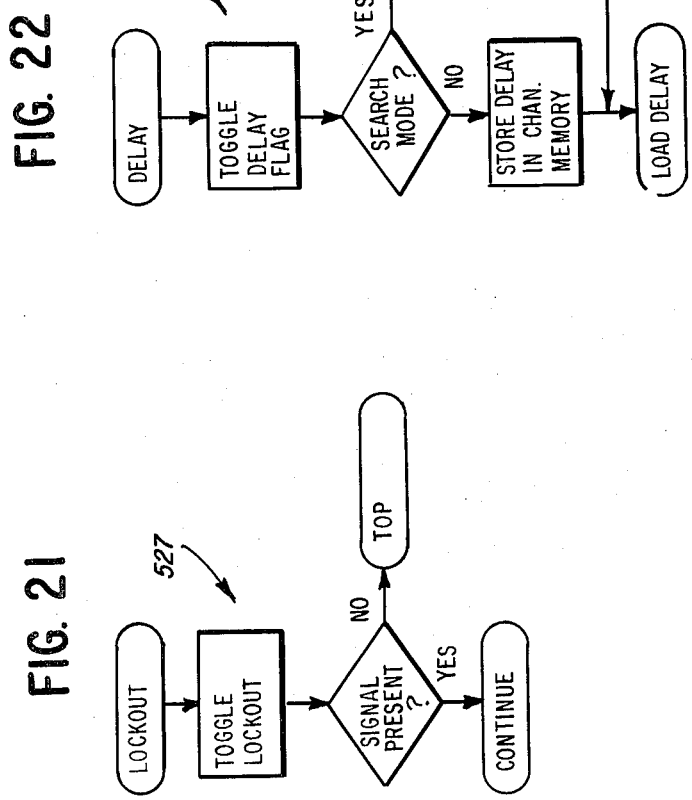
Figure 21:
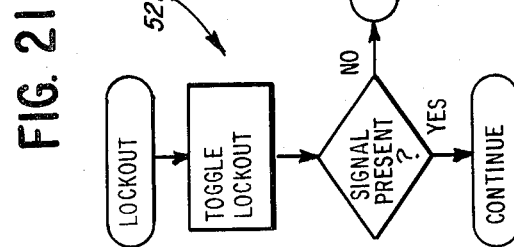

In FIG. 23, reference numeral 529 designates portions of the routine followed in connection with the keyboard and display.

Figure 24:
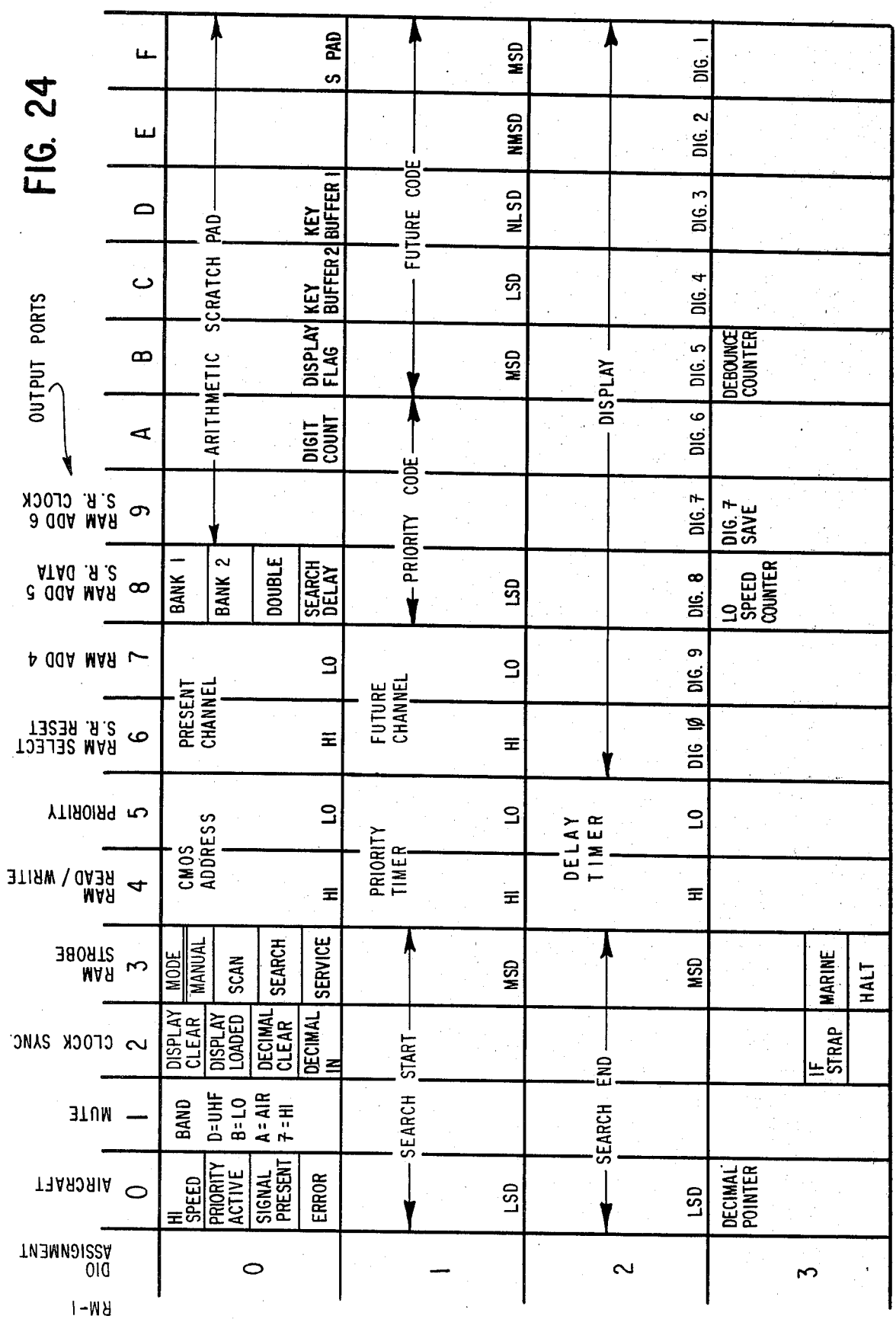
FIG. 24 is a chart constituting a map of the memory of the precessor circuitry of FIG. 8.

FIG. 24 is a chart constituting a map of the memory of the processor circuitry organized into four columns with 16 words in each column, four bits in each word. In the 00 address location, labeled "FLAGS" a high speed flag is set for performance of a scan or search at the high speed when set. A "priority active" flag is provided which is set during a priority sample and which indicates that the synthesizer contains the priority code. A "signal present" internal flag is provided that represents the state of the signal present input. An error flag is set whenever "Error" is to be displayed, it being noted that "Error" is never actually written into the display register.

A 01 memory address, labeled "BAND" contains a code that indicates the band of either the future code or the display frequency.

The 02 memory address, labeled "FLAGS" contains a "DISPLAY CLEAR" flag that indicates that the user has not entered a number. A "DISPLAY LOADED" flag which is a mainline routing flag indicates that display has been loaded with frequency, etc. during signal present. A "DECIMAL/CLEAR" flag keeps track of how many times the decimal/clear key has been pressed and a "DECIMAL IN" flag indicates that a decimal point is in the display.

Memory address 03, labeled "MODE", indicates the operating mode. Bits 1 through 4 respectively indicate the manual, scan, search and service modes, bit 4 being set in conjunction with bit 3.

Memory addresses 04 and 05 contain addresses for an external memory into which data may be entered such as that produced from operation of the numeric keys.

Memory addresses 06 and 07, labeled "PRESENT CHANNEL" indicate the channel that the system is presently on (0–19).

Memory address 08, labeled "FLAGS" contains flags "BANK ONE" and "BANK TWO" respectively indicating that bank one or bank two is active. "DOUBLE" is a mainline routing flag indicating that a "DOUBLE CONTINUE" must be executed, i.e., that the next future code must be found and output to the synthesizer and that the next code after that must be found. "SEARCH DELAY" indicates when a delay is selected for the search.

Memory addresses 09-0F, labeled "SCRATCH PAD", contain an arithmetic scratch pad and also contains several temporary registers used by the display routine.

Memory addresses 10-13 labeled "SEARCH START" contains the code for the lower search limit.

Memory addresses 14, 15, labeled "PRIORITY TIMER", count the number of interrupts to determine when a priority sample is due.

Memory addresses 16, 17, labeled "FUTURE CHANNEL" indicate the next channel to be scanned (0–19).

Memory addresses 18-1B, labeled "PRIORITY CODE", contains the same code as is in channel 1 in the memory, it being kept in a register for quick access.

Memory addresses 1C-1F, labeled "FUTURE CODE", contain the next code to be output during scan and search modes. During manual mode, it contains the present code that the user is looking at or listening to.

Memory addresses 20-23, labeled "SEARCH END", contain the code for the upper search limit. This register, along with the search start, is also used to hold the limits as they are entered until they can be tested to find which is upper and which is lower.

Memory addresses 24, 25, labeled "DELAY TIMER", counts the number of interrupts to determine when the delay time has elapsed.

Memory addresses 26-2F, labeled "DISPLAY", contain the data for refreshing the display.

Memory address 30, labeled "DECIMAL POINTER", indicates which digit the decimal point should appear in.

Memory address 31, labeled "FLAGS", is an IF strap which indicates which frequency, 10.8 MHz or 10.85 MHz, has been selected.

Memory address 33, labeled "FLAGS", contains a "MARINE" flag which indicates when a marine service search is called for and contains "HALT" which indicates when a search is on hold.

Memory address 38, labeled "LO SPEED COUNT", counts the number of interrupts to determine when to continue scanning or searching.

Memory address 39, labeled "DIG. 7 SAVE", is a save register for digit 7.

Memory address 3B, labeled "DEBOUNCE COUNT",, counts the number of keyboard strobes to determine when the debounce time has elapsed.

The code computation routines are important in connection with the operation of the processor and synthesizer circuitry. The conversions between synthesizer codes and display frequency are done by two subroutines "LOAD FUTURE FROM DISPLAY" and "LOAD DISPLAY FROM FUTURE". Both of these routines utilize several second-level subroutines.

The "LOAD FUTURE FROM DISPLAY" routine first corrects the display by adding leading and trailing zeros, if necessary. Next, the frequency is tested to be sure it is within band limits and the proper band code is loaded into band. The band code is required for later computations. The code is computed by first adding or subtracting the proper IF, depending upon the band. The frequency is then multiplied by 2,000 by dropping the decimal and adding the frequency to itself. If it is within the UHF band, it is also multiplied by 0.4. Then it is divided by 10, converted to binary hexidecimal and complemented.

The "LOAD DISPLAY FROM FUTURE" routine first loads band with the proper band code, then complements the code and converts it to BCD. The necessary multiplication is incorporated in the conversion by multiplying the conversion constant by either 50 or 125, according to the following table.

| Standard-Hex-To-BCD Conversion Factor | Lo/Air/Hi Band Conversion Factor (× 50) | UHF Band Conversion Factor (× 125) |
| --- | --- | --- |
| 1 | 50 | 125 |
| 16 | 800 | 2000 |
| 256 | 102800 | 32000 |
| 4096 | 204800 | 512000 |

The result of the conversion is divided by 10,000 by shifting the display to the right one place and inserting the decimal point. Finally the proper IF is added or subtracted. With this operation, the proper conversions can be made for output to the synthesizer and for converting back to a proper code for display when necessary.

It is noted that the first three most significant digits of the aircraft and high band codes are the same when such are applied to a synthesizer which creates no problem in connection with the synthesizer. However, for developing the A-band signal for application to the detector circuits, through line 82, an ambiguity must be avoided and for this purpose, the aircraft codes are offset by subtracting 8,000. Aircraft codes can thus be distinguished by examining the most significant digit which will be less than 3. A factor of 8,000 is then added to all aircraft codes before performing an operation such as "Output Code" or "Load Display From Future".

The channel data are stored in an external memory which may preferably be a CMOS memory and which may be a programmable read only memory operative in a manner such that data entered therein can be erased but at the same time can be stored indefinitely so that a program, once entered into the memory by the user, will be preserved when the receiver is disconnected from a voltage source.

The channel data are stored in the memory in five four-bit nibbles. The first nibble contains the lockout and delay flags. The remaining four nibbles contain the synthesizer code, beginning with the least significant nibble. In order to read the data for a particular channel, the channel number must be multiplied by five to obtain the proper address. The first memory location in the memory is not used in an actual embodiment because of a power-on problem that accidentally wrote into the first location. A sub-routine ADDRESS "PRESENT- /FUTURE CHANNEL" performs the necessary computations and stores the result in a memory address. The subroutine's "READ" and "WRITE" utilize this address and perform the actual data transfer between the accumulator and the memory. "READ CODE" and "WRITE CODE" are higher level subroutines that utilize "READ" and "WRITE" to transfer the four nibbles of the synthesizer code between the memory and the future code register. "READ CODE PLUS FLAGS" is a modification of "READ CODE" and also loads the display according to the lock-out and delay flags.

Figure 25:
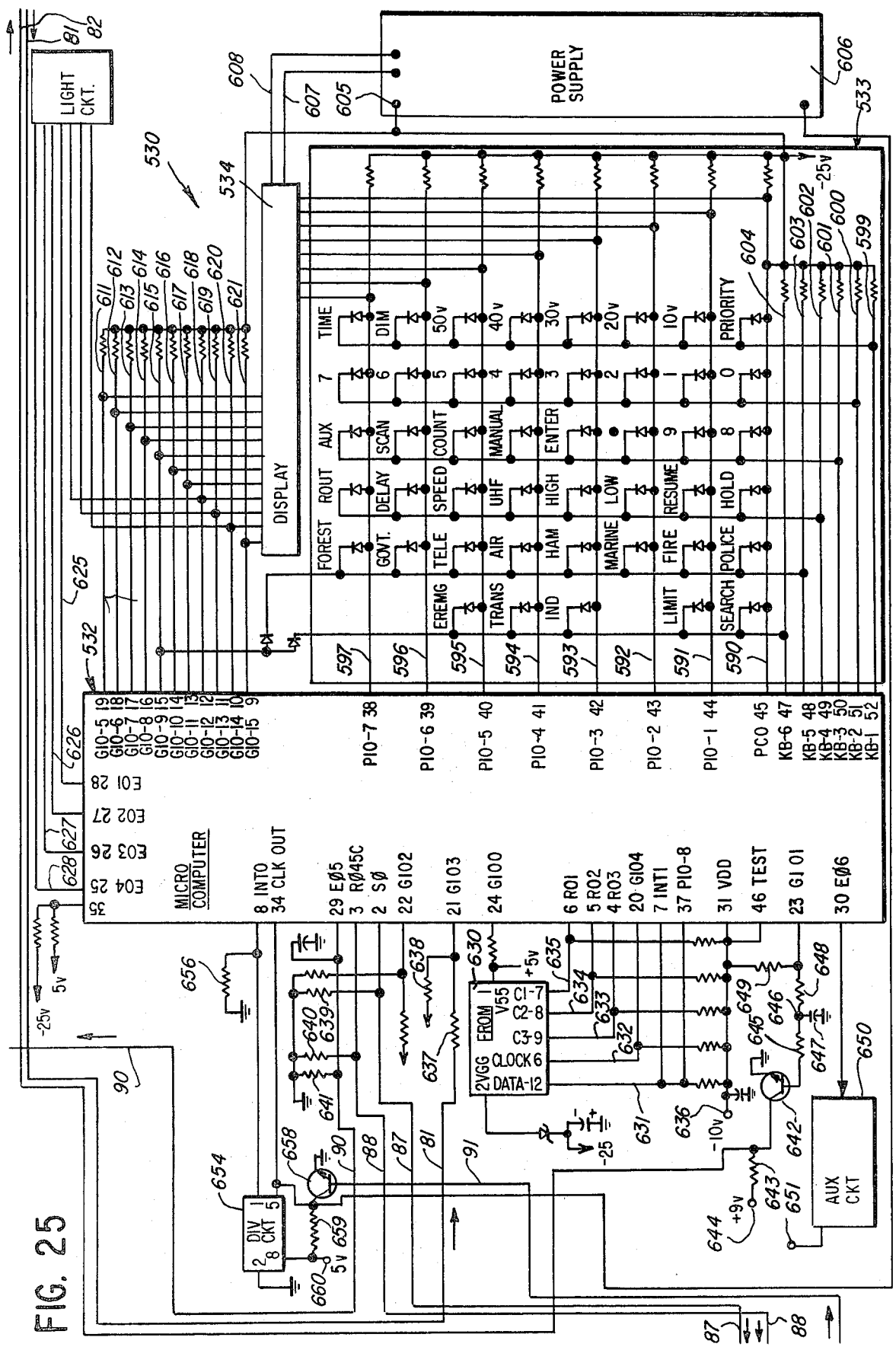
FIG. 25 is a schematic diagram of another form of processor circuitry in accordance with the invention.

FIG. 25 is a schematic diagram of another preferred form of keyboard, display and processor circuits, generally designated by reference numeral 530. The circuits include a single-chip microcomputer 532 which is manufactured by the Microelectronics Group of Rockwell International Corportion and designated as A91XX. The microcomputer 532 includes a central processing unit, a read-only memory, a random access memory, general purpose input/output buffers and latches.

Figure 26:
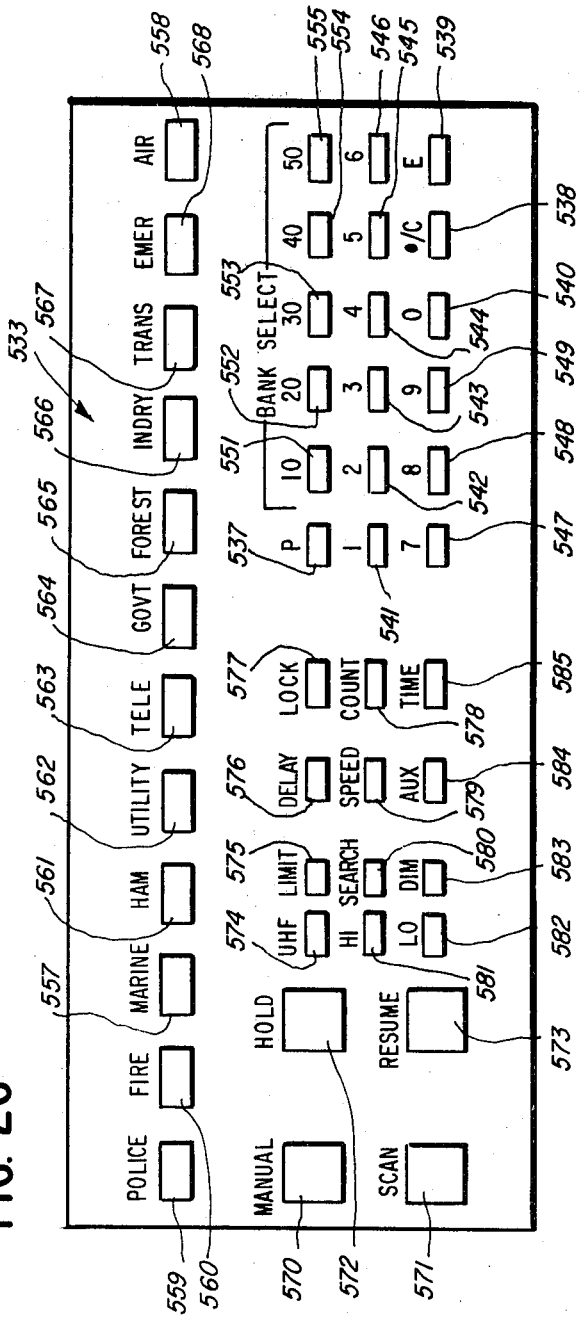
FIG. 26 is a plan view of a keyboard used in conjunction with the processor circuitry of FIG. 25.

The microcomputer 532 is connected to a keyboard 533 and a display 534 which are generally similar to the keyboard 26 and display 29 as illustrated in FIGS. 2 and 3. FIG. 26 shows the arrangement of keys of the keyboard 533. A program section 536 includes a priority key 537, a decimal point key 538, and enter key 539. Numeric keys 540-549 are provided and there are five bank select keys 551-555 for selection of five different banks labeled, "10", "20", "30", "40" and "50", each having ten channels.

The keyboard 533 further includes marine and aircraft keys 557 and 558 for searching through the marine and aircraft bands. A number of additional service search keys are provided, including keys 559-568 for searching through police, fire, amateur (HAM), utility, telephone, government, forestry, industry, transportion and emergency bands.

Keyboard 533 further includes a manual key 570, a scan key 571, a hold key 572, a resume key 573, and keys 574-585, respectively designated as "UHF", "Limit", "Delay", "Lock", "Count", "Speed", "Search", "Hi", "Lo", "Dim", "AUX" and "Time" keys.

The manual key 570, scan key 571, delay key 576, lock key 577, speed key 579, and search key 580 are for purposes similar to those of the corresponding keys of the keyboard 26, described hereinbefore. The count key 578 is active in a manual mode and is for the purpose of causing the display 534 to indicate the number of times that a current channel has been active since the counter was last cleared or since a new frequency was entered into the channel.

The hold key 572 performs one of the functions of the limit/hold 54 of the keyboard 26 and is active in search modes, including service search modes, to cause the sequencing of frequencies to halt and to cause the receiver to be active on the current frequency. Successive closures of the key 572 causes manual sequencing of search frequencies, one at a time. The selection of a current service search mode cancels a hold command.

The resume key 573 is active only in search modes after selection of hold by operation of the hold key 572, operating to cancel the hold command. The receiver then contains sampling of service of frequencies. However, it is noted that in performing the service searches with the keys 557-568, it is possible to search carefully through each category and make certain that no frequency will be missed. In connection with the service search operations, some of the service search categories include frequencies in two or three of the bands and in some cases, the user may wish to search only through the frequencies in one of the bands. In this case, the user can operate the UHF, HI and LO keys 574, 581 and 582 during a service search operation and select and deselect by toggle action each of the three sets of frequencies for each of such bands. The status is indicated on the display 534 as hereinafter described.

The dim key 573 causes all lighted display indicators to operate at reduced intensity for best eye comfort in a dark environment.

The "AUX" key is used to program for production of an auxiliary output function when a signal is present on a certain channel. During the manual mode, it is operated to program the current channel for development of the auxiliary output signal when the signal is present thereon.

The time key 585 is operable for displaying the time on the diplay 534.

Figure 27:
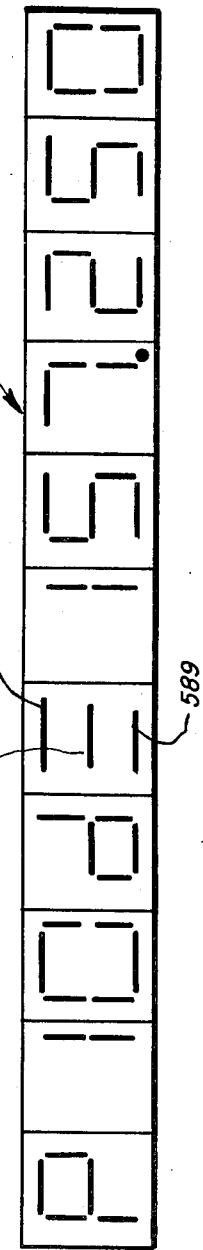
FIG. 27 is a plan view of a display used in conjunction with the processor circuitry of FIG. 25, showing indications obtained in one mode of operation.

The appearance of the display 534 as shown in FIG. 27 is similar to that of the display of 29 shown in FIG. 3. One difference relates to operation in the service search modes in which, as aforementioned, when a service category has frequencies in more than one band, the user can operate the UHF, HI and LO keys 574, 581 and 582 to select and deselect any one of the bands. The display 534 indicates the status of such frequencies in the fifth window from the left. As shown in FIG. 27, three vertically spaced horizontal bars 587, 588 and 589 appear which respectively indicate the UHF, H and L bands. Initially, all three bands are selected and all three of the horizontal bars 587, 588 and 589 will appear.

The microcomputer 532 is similar to the microcomputer 410 but has higher storage capacity in its memories. It includes a ROM having a 4096X8 capacity and a RAM having a 192X4 capacity. It also has internal circuitry which performs the same function as the shift register and flip-flop circuits 449 and 450 in strobing the keyboard and display. As indicated in FIG. 25, each key operated switch of the keyboard 533 has one contact connected to one of eight lines 590-597 which are connected to parallel input/output ports of the microcomputer 532 and each key operated switch has a second contact connected to one of six lines 599-604 which are respectively connected to "KB1" through "KB6" keyboard returns or discrete inputs of the microcomputer 532. All of the lines 590-597 and 599-604 are connected through resistors to a minus 25-volt terminal 605 of a voltage supply 606.

The lines 590-597 are also connected to input terminals of the display 534 which is a vacuum fluorescent display operated from the terminal 605 of the voltage supply 606 and also supplied with filament voltage therefrom through lines 607 and 608. The display 534 has eleven input terminals connected through lines 611-621 to general purpose input/output ports GIO-5 through GIO-15 of the microcomputer 532, also connected through resistors to the voltage supply terminal 605.

Lights may optionally be provided for indicating the operation of the service search keys and for selective operation of such lights, a circuit 624 is provided which is connected to lines 618-620 and through lines 625-628 to "Extended Output" terminals EO1-EO4 of the microcomputer 532.

An erasable or programmable read only memory 630 is provided for storing channel information, count bits, lock-out and other functions when the receiver is disconnected from a supply voltage source. The memory circuit 630 includes data, clock and control terminals 631–635 which are respectively connected to an interrupt terminal, a general purpose input/output terminal and three register output terminals of the microcomputer 532, all terminals being connected through resistors to a voltage supply terminal 636 which is connected to a voltage supply input terminal of the microcomputer 532.

The control signal developed on line 81 by the squelch circuitry is applied through a resistor 637 to another general purpose input/output terminal of the microcomputer 532 which is also connected through a resistor 638 to the voltage supply terminal 636.

Data and clock signals for serial transmission of the frequency code to the synthesizer circuit through lines 87 and 88 are developed from serial output and serial clock terminals of the microcomputer 532 which are connected through resistors 639 and 640 to ground. The mute signal on line 90 is developed on an extended output terminal which is connected through a resistor 641 to ground.

The A band control signal on line 82 is developed at the collector of a transistor 642 which is connected through a resistor 643 to a plus 9 supply voltage terminal 644. The emitter of the transistor 642 is connected to ground while the base thereof is connected through a resistor 645 to a circuit point 646 which is connected through a capacitor 647 to ground and which is connected through a resistor 648 to a general purpose input/output terminal of the microcomputer 532, the terminal being also connected to a terminal 649 to the power supply terminal 636.

A circuit 650 is provided for developing an auxiliary output signal at a terminal 651. The circuit 650 may be similar to that used to develop the A band control signal and has an input connected to an extended output terminal of the microcomputer 532.

A circuit 654 is provided for developing an interrupt signal which is applied through a line 655 to an interrupt terminal of the microcomputer 532, the interrupt terminal being connected through a resistor 656 to ground. The circuit 654 may be a divide-by-54,167 circuit which is supplied with a input signal at a frequency of 867 KHz to develop an output signal at about 16 Hz. A terminal of the circuit 654 is connected to a clock select terminal of the microcomputer 532 and is also connected to the collector of a transistor 658 which is connected through a resistor 659 to a +5 volt voltage supply terminal 660. The emitter of the transistor 658 is grounded while the base thereof is connected through the line 91 to the oscillator and frequency synthesizer circuits 71. In this case, the line 91 may be coupled within the circuits 71 to the 867 KHz output terminals 355 of the circuit 300, through coupling circuitry similar to that used to couple to the terminal 342 in the illustrated arrangement. The collector of the transistor 658 may also be connected through a line 661 to the power supply circuit 606 which may include divider circuit operative to develop a 25 KHz signal which is amplified and rectified to develop the supply voltage for the vacuum fluorescent display 534.

The operation of the processor 530 is similar to that of the processor of FIG. 8 and the overall program flow is substantially the same. However, the find future routine is expanded for the service search operations, many bands in addition to the aircraft and marine bands being provided.

FIG. 28 is a flow chart illustrating a load future service search routine incorporated in the system 530 and generally designated by reference number 666.

When a service search key is pressed, a number uniquely associated with that service is loaded into a service selector register. The service selector is examined in a "find future" routine to determine which service search, if any, is to be performed. Once a proper search is determined, the processor accesses the appropriate set of tables and reads the next table entry as described below.

Each service search has up to three frequency tables associated with it, one table for each band. Attention is invited to the foregoing discussion of the operation of the UHF, HI and LO keys 574, 581 and 582. After running through a table, the processor tests the band disable flag associated with the proper band key to see if the next band is deselected. If it is, the processor proceeds to the next table and tests the flag for it.

The band disable flags are set by the processor to the appropriate state when a service search is first selected. The flags can then be modified by the user through use of the band keys 574, 581 and 582. The processor tests if the user has selected an invalid band, in which case the key is ignored, or if all bands are deselected, in which case the processor selects all appropriate bands.

The frequency tables contain two different types of data that are distinguishable by examination. The first type is a frequency code. If the processor determines that the data read is a frequency code, the code is transferred to the future code register.

The second type of data is an increment/count. The processor breaks this data word into two parts, the increment constant and the repeat count. The increment is added to the number already in the future code register to obtain a new future code. After the future code has been output to the synthesizer, the future code is again incremented. The process is repeated many times as is indicated by the repeat count. When the process is done, the next entry is read from the frequency table. A special data word is included as the last entry of the table to indicate the end. The processor then accesses the next table as described above.

In FIG. 27, reference 677 designates a key action routine for the police band, being a typical key action for all service search keys. In FIG. 28, reference numeral 668 designates the key action routine for the "HI" band key which is simply applying a signal to toggle the high band in band select.

With the operation as described and illustrated, the required memory capability of the microcomputer is greatly reduced. It is noted that although the frequencies in the service bands are not typically in regular frequency difference intervals, there are sub bands which do have frequencies at regular intervals between lower and upper limits, such that a very significant reduction in the memory requirement can be obtained through the described operation of the processor.

We claim:

1. A scanning radio receiver for receiving signals in frequency ranges including an aircraft band extending from about 118 to about 136 MHz and designated for AM operation and at least one public service band in a neighboring frequency range designated for FM operation, comprising: RF input means for receiving signals in the channels of both of said bands, tuning and frequency converting means coupled to said RF input means for converting received signals in any channel of either band into a converted signal having a frequency composition centered on a fixed IF frequency, channel selection means for controlling said tuning and frequency converting means, IF amplifier means tuned to said fixed IF frequency for amplifying said received and converted signals, detector means coupled to IF amplifier means, and audio amplifier means coupled to said detector means, said detector means including an AM demodulator for producing a first demodulated signal in response to converted and amplified signals which are amplitude modulated, and a FM demodulator for producing a second demodulated signal in response to converted and amplified signals which are frequency modulated, mode control means controlled by said channel selection means to operate in an AM mode for obtaining amplification by said audio amplifier means of only said first demodulated signal from said AM demodulator when a channel in said aircraft band is selected and to operate in am FM mode for obtaining amplification of only said second demodulated signal from said FM demodulator when a channel in a public service band designated for FM operation is selected, said FM demodulator being also operative to develop noise components at frequencies of on the order of 8 KHz in the absence of a carrier component of said converted and amplified signal at said IF frequency, squelch means including means for detecting said noise components which are produced by said FM demodulator at said frequencies of on the order of 8 KHz, and inhibiting means responsive to detection of said noise components for inhibiting amplification of any audio signal by said audio amplifier means, said FM demodulator being operative during both said AM and FM modes of operation of said mode control means in developing said noise components in the absence of a carrier component and for detection of said noise components by said squelch means to inhibit amplification of any audio signal by said amplifier means.

2. In a scanning radio receiver as defined in claim 1, said inhibiting means including a Schmitt trigger circuit.

3. In a scanning radio receiver as defined in claim 1, said FM demodulator having an S curve output characteristic as a function of frequency in changing from one value at a frequency below said IF frequency to a second value at a frequency above said IF frequency, window detector means responsive to said FM demodulator and coupled to said inhibiting means, said window detector means being controlled as a function of said S curve output characteristic to effect operation of said inhibiting means when said output of said FM demodulator is outside preset limits which are between said first and second values of said S curve output characteristic.

* * * * *

UNITED STATES PATENT AND TRADEMARK OFFICE
CERTIFICATE OF CORRECTION

PATENT NO. : 4,398,304  Page 1 of 2
DATED : August 9, 1983
INVENTOR(S) : George H. Fathauer and Wayne Holst It is certified that error appears in the above-identified patent and that said Letters Patent are hereby corrected as shown below:

Column 3, line 48, "receiving" first occurrence should be --receiver--.

Column 4, line 14, "on" should be "to".

Column 4, line 61, "precessor" should be "processor".

Column 11, line 62, "movably" should be "movable".

Column 13, line 14, "righthand" should be "right-hand".

Column 14, line 27, "165" should be "265".

Column 16, line 17, "two" should be "too".

Column 17, line 36, after "applied", insert -- to --.

Column 20, line 2, "provides" should be "provide".

UNITED STATES PATENT AND TRADEMARK OFFICE
CERTIFICATE OF CORRECTION

PATENT NO. : 4,398,304         Page 2 of 2
DATED      : August 9, 1983
INVENTOR(S): George H. Fathauer and Wayne Holst It is certified that error appears in the above-identified patent and that said Letters Patent are hereby corrected as shown below:

Column 22, line 29, after "450", insert the following:
-- to develop signals which are read into the memory 434 --.
Column 22, line 52, "437" should be "473".
Column 25, line 47, insert "In" before "FIG. 9A".
Column 26, line 57, after "designate", insert an "a".
Column 30, last line: ADDRESS "PRESENT- should read as follows:
    "ADDRESS PRESENT.
Column 31, line 37, "transportion" should be "transportation".
Column 32, line 22, after "display" delete "of".
Column 33, line 46, after "with", delete "a" and insert "an",
    (first occurrence).
Column 34, line 46 "677" should be "667".
Column 35, line 21 "am" should be "an".

Signed and Sealed this

Tenth Day of July 1984

[SEAL]

Attest:

GERALD J. MOSSINGHOFF

Attesting Officer

Commissioner of Patents and Trademarks